(12) United States Patent
Grosz et al.

(10) Patent No.: US 10,450,842 B2
(45) Date of Patent: Oct. 22, 2019

(54) SHAPE-BASED MODELING OF INTERACTIONS BETWEEN DOWNHOLE DRILLING TOOLS AND ROCK FORMATION

(71) Applicant: Halliburton Energy Services, Inc., Houston, TX (US)

(72) Inventors: Gregory Christopher Grosz, Magnolia, TX (US); Shilin Chen, Montgomery, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 306 days.

(21) Appl. No.: 15/329,213

(22) PCT Filed: Aug. 26, 2014

(86) PCT No.: PCT/US2014/052704
§ 371 (c)(1),
(2) Date: Jan. 25, 2017

(87) PCT Pub. No.: WO2016/032441
PCT Pub. Date: Mar. 3, 2016

(65) Prior Publication Data
US 2017/0211357 A1    Jul. 27, 2017

(51) Int. Cl.
*E21B 41/00* (2006.01)
*E21B 10/42* (2006.01)
*E21B 10/43* (2006.01)

(52) U.S. Cl.
CPC .......... *E21B 41/0092* (2013.01); *E21B 10/42* (2013.01); *E21B 10/43* (2013.01); *E21B 2010/425* (2013.01)

(58) Field of Classification Search
CPC ...... E21B 41/0092; E21B 10/42; E21B 10/43; E21B 2010/425
See application file for complete search history.

(56) References Cited

U.S. PATENT DOCUMENTS 1,159,087 A    11/1915 Reed
1,790,613 A    1/1931 Gildersleeve et al.
(Continued)

FOREIGN PATENT DOCUMENTS

CN    101460701    6/2009
CN    203729882    7/2014
(Continued)

OTHER PUBLICATIONS

Dupriest et al. "Maximizing Drill Rates with Real-Time Surveillance of Mechanical Specific Energy", SPE/IADC Drilling Conference 92194, 2006, 10 pages. (Year: 2006).*
(Continued)

*Primary Examiner* — Suzanne Lo
(74) *Attorney, Agent, or Firm* — Baker Botts L.L.P.

(57) ABSTRACT

A method of designing a downhole drilling tool may include generating a three dimensional (3D) downhole drilling tool model and simulating engagement of the drilling tool model with a 3D model of a borehole bottom. First and second cutting zones of first and second cutting elements may be determined based on areas of the first and second cutting elements that engage the borehole bottom, where the first and second cutting zones respectively have first and second cutting zone shapes. First and second cutting forces for the first and second cutting elements may be calculated based on the respective first and second cutting zone shapes. A drilling efficiency of the drilling tool model may be modeled based at least on the first cutting force and the second cutting force and a design parameter of the drilling tool model may be modified based on the drilling efficiency of the drilling tool model.

18 Claims, 22 Drawing Sheets

(56) References Cited

U.S. PATENT DOCUMENTS

| | | |
|---|---|---|
| 2,297,157 A | 9/1942 | McClinton |
| 2,634,955 A | 4/1953 | Johnson |
| 2,886,293 A | 5/1959 | Carr et al. |
| 2,915,291 A | 12/1959 | Gulfelt |
| 4,222,446 A | 9/1980 | Vasek |
| 4,553,615 A | 11/1985 | Grainger |
| 4,751,972 A | 6/1988 | Jones et al. |
| 5,799,741 A | 9/1998 | Kosobrodov et al. |
| 6,021,859 A | 2/2000 | Tibbitts et al. |
| 6,246,974 B1 | 6/2001 | Jelley et al. |
| 6,374,926 B1 | 4/2002 | Goldman et al. |
| 6,879,947 B1 | 4/2005 | Glass |
| 7,243,745 B2 | 7/2007 | Skeem et al. |
| 7,762,359 B1 | 7/2010 | Miess |
| 7,866,413 B2 | 1/2011 | Stauffer et al. |
| 8,037,951 B2 | 10/2011 | Shen et al. |
| 8,112,258 B2 | 2/2012 | Durairajan et al. |
| 8,150,667 B2 | 4/2012 | Ledgerwood |
| 8,437,995 B2 | 5/2013 | Matthews et al. |
| 8,561,728 B2 | 10/2013 | Cooley et al. |
| 8,589,124 B2 | 11/2013 | Huang |
| 8,720,611 B2 | 5/2014 | Chen |
| 2004/0011159 A1 | 1/2004 | Meiners et al. |
| 2005/0015229 A1 | 1/2005 | Huang |
| 2005/0133260 A1 | 6/2005 | Singh et al. |
| 2005/0133272 A1 | 6/2005 | Huang et al. |
| 2006/0100836 A1 | 5/2006 | Singh |
| 2007/0093996 A1 | 4/2007 | Cariveau et al. |
| 2008/0251293 A1 | 10/2008 | Mumma et al. |
| 2010/0059287 A1 | 3/2010 | Durairajan et al. |
| 2010/0211362 A1* | 8/2010 | Huang .................... E21B 10/00 703/1 |
| 2011/0015911 A1 | 1/2011 | Chen |
| 2011/0031031 A1 | 2/2011 | Vempati et al. |
| 2012/0132471 A1 | 5/2012 | Zhang et al. |
| 2012/0152623 A1 | 6/2012 | Chen |
| 2012/0152624 A1 | 6/2012 | Chen |
| 2013/0068534 A1 | 3/2013 | Digiovanni et al. |
| 2013/0087391 A1 | 4/2013 | Hall et al. |
| 2013/0238245 A1 | 9/2013 | Chen et al. |
| 2013/0292185 A1 | 11/2013 | Knull et al. |
| 2014/0039854 A1 | 2/2014 | Huang |
| 2014/0095134 A1 | 4/2014 | Cariveau et al. |
| 2014/0110181 A1 | 4/2014 | Zhange et al. |
| 2014/0182947 A1 | 7/2014 | Bhatia et al. |
| 2015/0275584 A1 | 10/2015 | Mensa-Wilmot |

FOREIGN PATENT DOCUMENTS

| | | | |
|---|---|---|---|
| EP | 0972908 | 1/2000 | |
| WO | 2013/180702 | 12/2013 | ............ E21B 10/43 |
| WO | 2014/012038 | 1/2014 | |
| WO | 2014/078342 | 5/2014 | ............ E21B 12/00 |

OTHER PUBLICATIONS

Hareland et al. "Cutting Efficiency of a Single PDC Cutter on Hard Rock" Journal of Canadian Petroleum Technology, Jun. 2009, 11 pages. (Year: 2009).*

International Search Report and Written Opinion for PCT Patent Application No. PCT/US2015/036424, dated Mar. 18, 2016; 12 pages.

Office Action for Chinese Patent Application No. 2955670, dated Jan. 2, 2018; 4 pages.

Office Action for Canadian Patent Application No. 2955670, dated Jan. 2, 2018; 4 pages.

Office Action for Canadian Patent Application No. 2955670, dated Sep. 17, 2018; 4 pages.

Richard, T. et al.; "Influence of Groove Geometry and Cutter Inclination in Rock Cutting"; ARMA 10-429; 44th U.S. Rock Mechanics Symposium and 5th U.S.-Canada Rock Mechanics Symposium; American Rock Mechanics Association; 9 pages, Jun. 27, 2010.

Chen, Shilin; "The Role of 3-D Rock Chips and Cutting Area Shapes in PDC Bit Design Optimization;" SPE 171833-MS; 19 pages, 2014.

International Search Report and Written Opinion, Application No. PCT/US2014/0331193; 18 pgs, dated Jan. 8, 2015.

Enders, Lanson Adam; "Computation modeling of drill bits : a new method for reproducing bottom hole geometry and a second-order explicit integrator via composition for coupled rotating rigid bodies;" Electronics Theses and Dissertations, UC San Diego; 184 pages, 2007.

Warren et al.; "Drag-Bit Performance Modeling"; SPE Drilling Engineering; vol. 4; No. 2, 119-127; 9 pages, 1989.

International Search Report and Written Opinion, Application No. PCT/US2014/052704; 15 pgs, dated May 19, 2015.

International Preliminary Report on Patentability of PCT Patent Application No. PCT/US2014/052704, dated Mar. 9, 2017; 10 pages.

Glowka, David A.; "Use of Single-Cutter Data in the Analysis of PDC Bit Designs: Part 1—Development of a PDC Cutting Force Model"; SPE; Sandia National Laboratories; 9 pages, Aug. 1989.

Glowka, David A.; "Use of Single-Cutter Data in the Analysis of PDC Bit Designs: Part 2—Development and Use of the PDCWEAR Computer Cope"; SPE; Sandia National Laboratories; 10 pages, Aug. 1989.

* cited by examiner

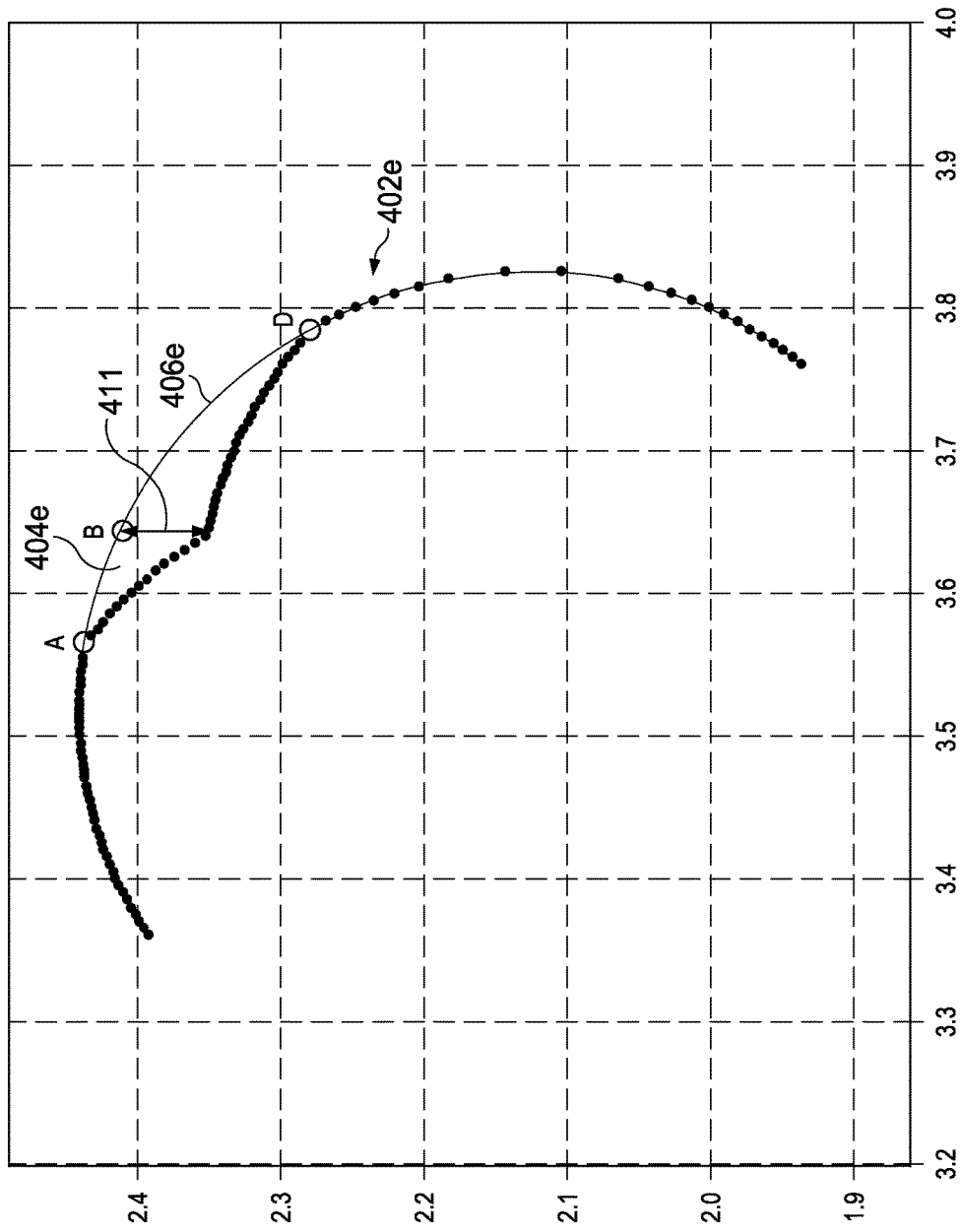

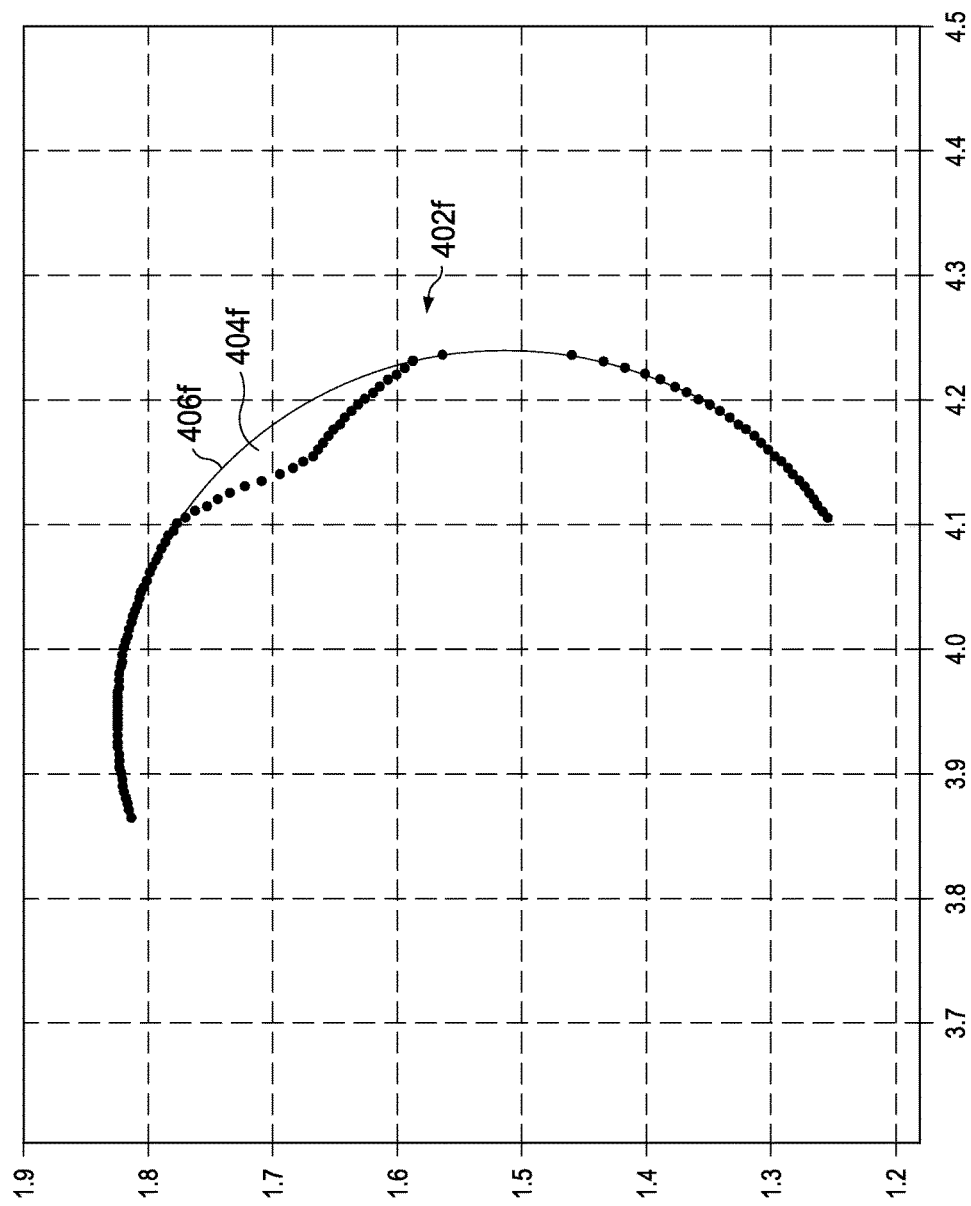

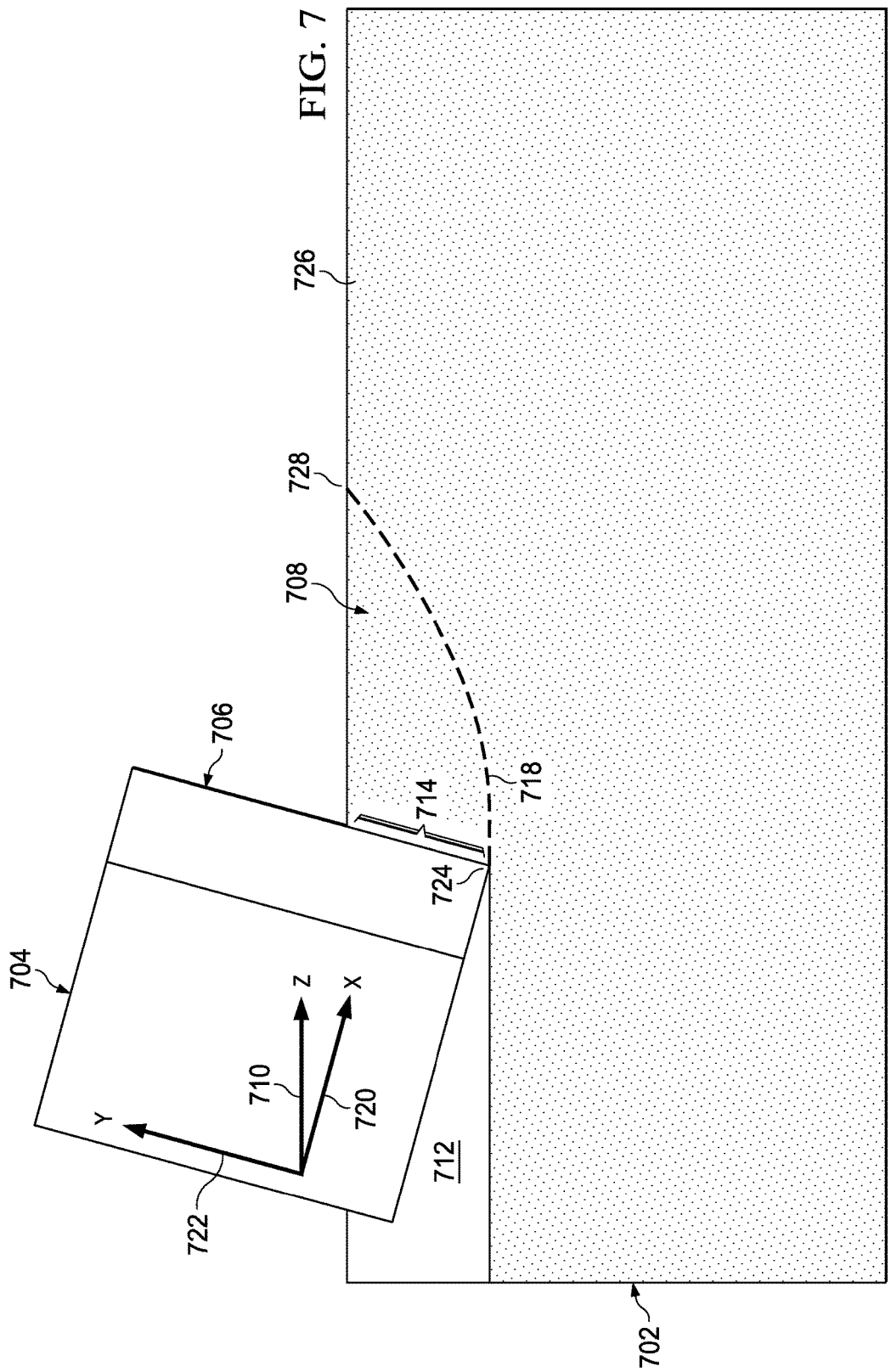

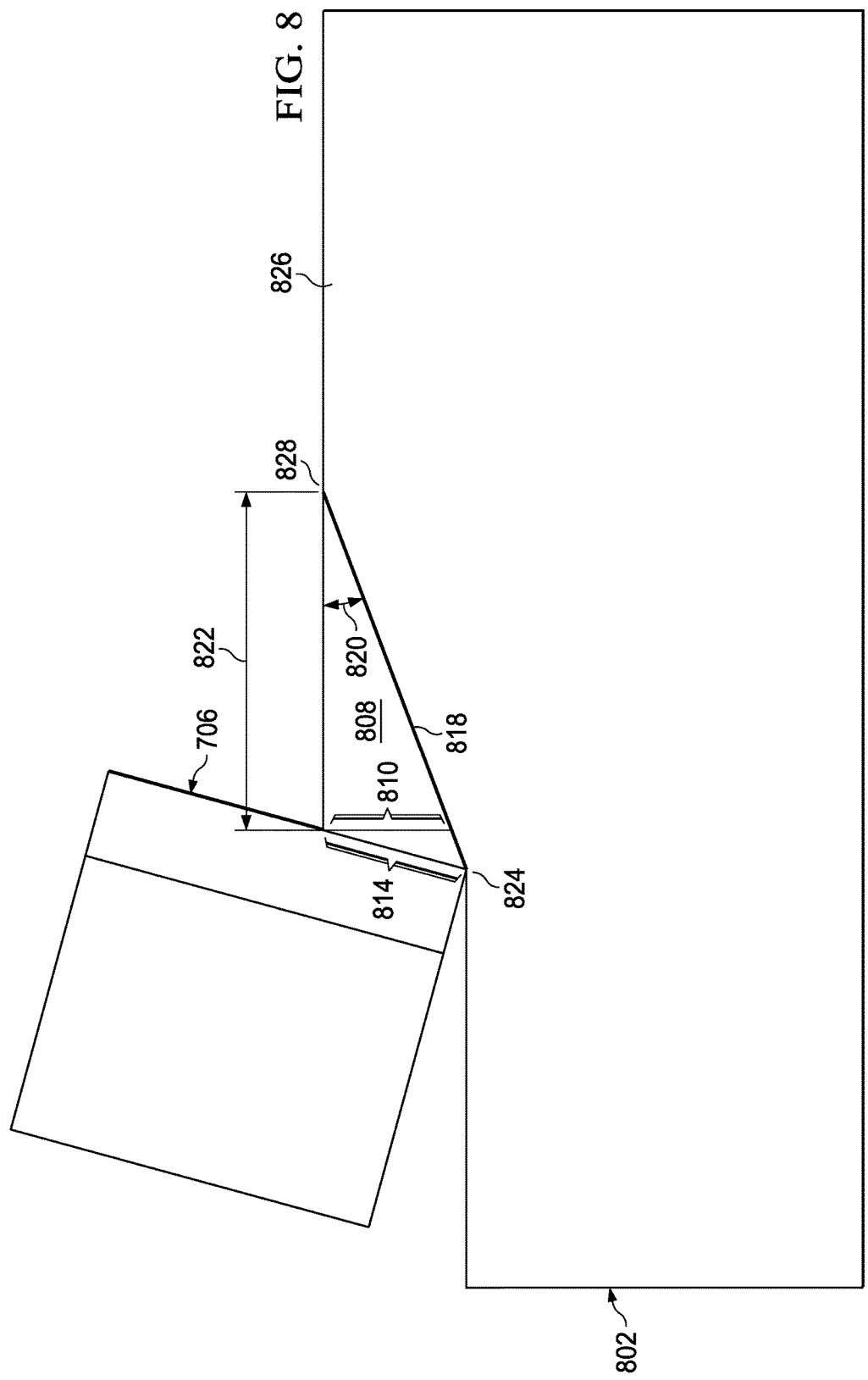

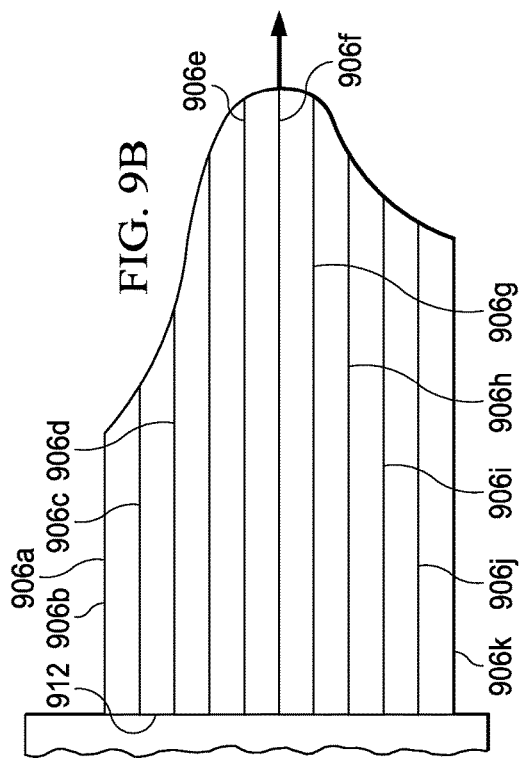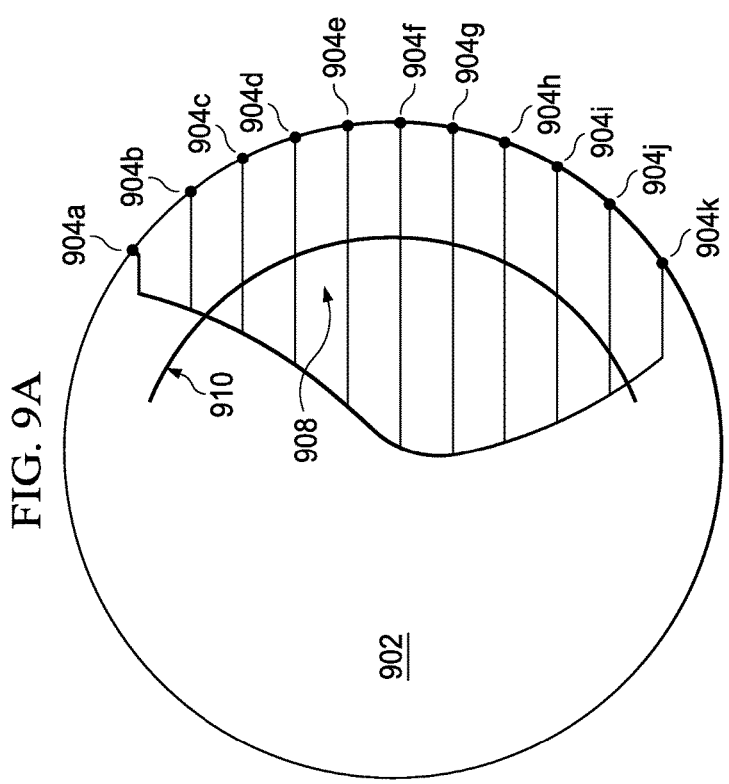

SHAPE-BASED MODELING OF INTERACTIONS BETWEEN DOWNHOLE DRILLING TOOLS AND ROCK FORMATION

RELATED APPLICATIONS

This application is a U.S. National Stage Application of International Application No. PCT/US2014/052704 filed Aug. 26, 2014, which designates the United States, and which is incorporated herein by reference in its entirety.

TECHNICAL FIELD

The present disclosure relates generally to downhole drilling tools and, more particularly, to modeling of interactions between downhole drilling tools and rock formations.

BACKGROUND

Various types of tools are used to form wellbores in subterranean formations for recovering hydrocarbons such as oil and gas lying beneath the surface. Examples of such tools include rotary drill bits, hole openers, reamers, and coring bits. Rotary drill bits include, but are not limited to, fixed cutter drill bits, such as polycrystalline diamond compact (PDC) drill bits, drag bits, matrix drill bits, rock bits, and roller cone drill bits. A fixed cutter drill bit typically includes multiple blades each having multiple cutting elements, such as the PDC cutting elements on a PDC bit.

In typical drilling applications, a PDC bit may be used to drill through various levels or types of geological formations. Typical formations may generally have a relatively low compressive strength in the upper portions (e.g., lesser drilling depths) of the formation and a relatively high compressive strength in the lower portions (e.g., greater drilling depths) of the formation. Thus, it typically becomes increasingly more difficult to drill at increasingly greater depths. Accordingly, the ideal bit for optimizing drilling efficiency typically changes as a function of the type of geological formation and the drilling depth. One example model that has been used to model efficiency of drilling tools is known as a single cutter force model. Single cutter force models may calculate forces acting on individual cutting elements and sum those forces to estimate total forces acting on the drilling tool.

BRIEF DESCRIPTION OF THE DRAWINGS

For a more complete understanding of the present disclosure and its features and advantages, reference is now made to the following description, taken in conjunction with the accompanying drawings, in which:

FIGS. 4A-4D illustrate cutting zones of various cutting elements disposed along a blade;

FIG. 7 illustrates a cross sectional view of an exemplary cutting element engaged with a geological formation;

FIG. 8 illustrates a modeled approximation of a rock chip;

FIG. 9A illustrates a three dimensional rock chip divided into an exemplary group of cutlets;

FIG. 9B illustrates exemplary two dimensional rock chip lengths included in an associated three dimensional rock chip;

DETAILED DESCRIPTION

A drill bit model and related systems and methods are disclosed, directed to modeling drilling efficiency of downhole drilling tools. In a drill bit model, the area of a particular cutting element that interacts with and cuts into a rock formation may be referred to as the cutting zone of a cutting element. In broad terms, one aspect of the disclosed drilling tool model takes into consideration how the shapes of cutting zones on the respective faces of cutting elements affect the amount of energy required by a drill bit to drill a particular volume of rock. By considering the shape of the cutting zones of the cutting elements, the disclosed models are able to more accurately analyze and/or predict the drilling efficiency of downhole drilling tools. There are numerous ways in which the shapes of the cutting zones may be considered and factored into downhole drilling tool models. Thus, embodiments of the present disclosure and its advantages are best understood by referring to FIGS. 1 through 18, where like numbers are used to indicate like and corresponding parts.

Figure 1:
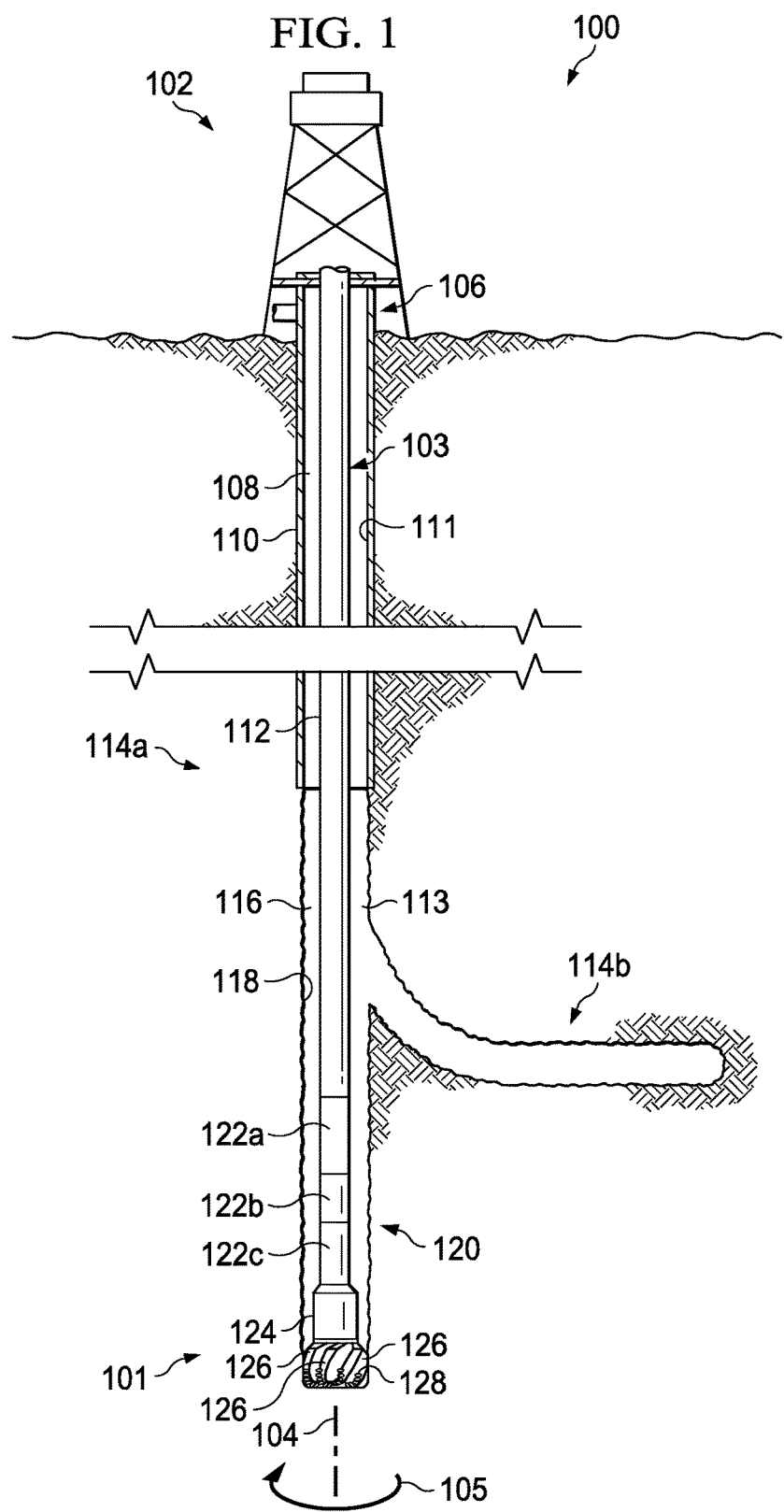
FIG. 1 illustrates an elevation view of an example embodiment of a drilling system.

FIG. 1 illustrates an elevation view of an example embodiment of drilling system 100. Drilling system 100 may include well surface or well site 106. Various types of drilling equipment such as a rotary table, drilling fluid pumps and drilling fluid tanks (not expressly shown) may be located at well surface or well site 106. For example, well site 106 may include drilling rig 102 that may have various characteristics and features associated with a "land drilling rig." However, downhole drilling tools incorporating teachings of the present disclosure may be satisfactorily used with drilling equipment located on offshore platforms, drill ships, semi-submersibles and drilling barges (not expressly shown).

Drilling system 100 may also include drill string 103 associated with drill bit 101 that may be used to form a wide variety of wellbores or bore holes such as generally vertical wellbore 114a or generally horizontal wellbore 114b or any combination thereof. Various directional drilling techniques and associated components of bottom hole assembly (BHA) 120 of drill string 103 may be used to form horizontal wellbore 114b. For example, lateral forces may be applied to BHA 120 proximate kickoff location 113 to form generally horizontal wellbore 114b extending from generally vertical wellbore 114a. The term "directional drilling" may be used to describe drilling a wellbore or portions of a wellbore that extend at a desired angle or angles relative to vertical. The desired angles may be greater than normal variations associated with vertical wellbores. Direction drilling may also be described as drilling a wellbore deviated from vertical. The term "horizontal drilling" may be used to include drilling in a direction approximately ninety degrees (90°) from vertical.

BHA 120 may be formed from a wide variety of components configured to form wellbore 114. For example, components 122a, 122b and 122c of BHA 120 may include, but are not limited to, drill bits (e.g., drill bit 101), coring bits, drill collars, rotary steering tools, directional drilling tools, downhole drilling motors, reamers, hole enlargers or stabilizers. The number and types of components 122 included in BHA 120 may depend on anticipated downhole drilling conditions and the type of wellbore that will be formed by drill string 103 and rotary drill bit 101. BHA 120 may also include various types of well logging tools (not expressly shown) and other downhole tools associated with directional drilling of a wellbore. Examples of logging tools and/or directional drilling tools may include, but are not limited to, acoustic, neutron, gamma ray, density, photoelectric, nuclear magnetic resonance, rotary steering tools and/or any other commercially available well tool. Further, BHA 120 may also include a rotary drive (not expressly shown) connected to components 122a, 122b and 122c and which rotates at least part of drill string 103 together with components 122a, 122b and 122c.

Wellbore 114 may be defined in part by casing string 110 that may extend from well surface 106 to a selected downhole location. Portions of wellbore 114, as shown in FIG. 1, that do not include casing string 110 may be described as "open hole." Various types of drilling fluid may be pumped from well surface 106 through drill string 103 to attached drill bit 101. The drilling fluids may be directed to flow from drill string 103 to respective nozzles (depicted as nozzles 156 in FIG. 2) passing through rotary drill bit 101. The drilling fluid may be circulated back to well surface 106 through annulus 108 defined in part by outside diameter 112 of drill string 103 and inside diameter 118 of wellbore 114a. Inside diameter 118 may be referred to as the "sidewall" of wellbore 114a. Annulus 108 may also be defined by outside diameter 112 of drill string 103 and inside diameter 111 of casing string 110. Open hole annulus 116 may be defined as sidewall 118 and outside diameter 112.

Drilling system 100 may also include rotary drill bit ("drill bit") 101. Drill bit 101, discussed in further detail in FIG. 2, may include one or more blades 126 that may be disposed outwardly from exterior portions of rotary bit body 124 of drill bit 101. Blades 126 may be any suitable type of projections extending outwardly from rotary bit body 124. Drill bit 101 may rotate with respect to bit rotational axis 104 in a direction defined by directional arrow 105. Blades 126 may include one or more cutting elements 128 disposed outwardly from exterior portions of each blade 126. Blades 126 may also include one or more depth of cut controllers (not expressly shown) configured to control the depth of cut of cutting elements 128. Blades 126 may further include one or more gage pads (not expressly shown) disposed on blades 126. Drill bit 101 may be designed and formed in accordance with teachings of the present disclosure and may have many different designs, configurations, and/or dimensions according to the particular application of drill bit 101.

The configuration of cutting elements 128 on drill bit 101 and/or other downhole drilling tools may also contribute to the drilling efficiency of the drill bit. Cutting elements 128 may be laid out according to two general principles: single-set and track-set. In a single-set configuration, each of cutting elements 128 on drill bit 101 may have a unique radial position with respect to bit rotational axis 104. In a track-set configuration, at least two of cutting elements 128 of drill bit 101 may have the same radial position with respect to bit rotational axis 104. Track-set cutting elements may be located on different blades of the drill bit. Drill bits having cutting elements laid out in a single-set configuration may drill more efficiently than drill bits having a track-set configuration while drill bits having cutting elements laid out in a track-set configuration may be more stable than drill bits having a single-set configuration.

It may be advantageous to model a drill efficiency of a downhole drilling tool by accounting for the shapes of the cutting zones of the cutting elements of a drill bit that interacts with the geological formation. It may also be advantageous to model a drilling efficiency of a downhole drilling tool by incorporating interactions between downhole drilling tools and rock chips, as disclosed in further detail below. For example, during operation of drilling system 100, when drill bit 101 contacts the bottom of wellbore 114a or the end of horizontal wellbore 114b, blades 126 or cutting elements 128 may mechanically scrape the formations surrounding wellbores 114, causing pieces of rock to separate from the formations. Drill bit 101 may further cause rock chips to separate from the formations in advance of blades 126 or cutting elements 128. The amount of energy required to separate a particular volume of rock from a formation may correlate to the drilling efficiency of a drill bit. While drilling into different types of geological formations it may be advantageous to optimize the design or model the drilling efficiency of downhole drilling tools in order to select a downhole drilling tool that maximizes drilling efficiency. As disclosed in further detail below, drilling models (not expressly shown in FIG. 1) may be used to select high efficiency downhole drilling tools (e.g., a drill bit, a reamer, a hole opener, etc.) from a group of available downhole drilling tools. A downhole drilling model may also be configured to optimize a design of a drill bit to increase drilling efficiency.

Drill bit 101 may be designed or manufactured in accordance with teachings of the present disclosure and may have different designs, configurations, and/or dimensions according to a particular application of drill bit 101. A downhole drilling model may be configured to analyze an efficiency of a downhole drilling tool by incorporating interactions between downhole drilling tools and rock chips. The downhole drilling model may also be configured to design or select a high efficiency downhole drilling tool based on a downhole drilling model utilizing shape-based modeling of the cutting forces of the respective cutting elements of a drill bit and/or modeling of rock chip interactions associated with the downhole drilling tool. A downhole drilling model according to the present disclosure may improve accuracy of predictions of drilling efficiencies of downhole drilling tools.

Figure 2:
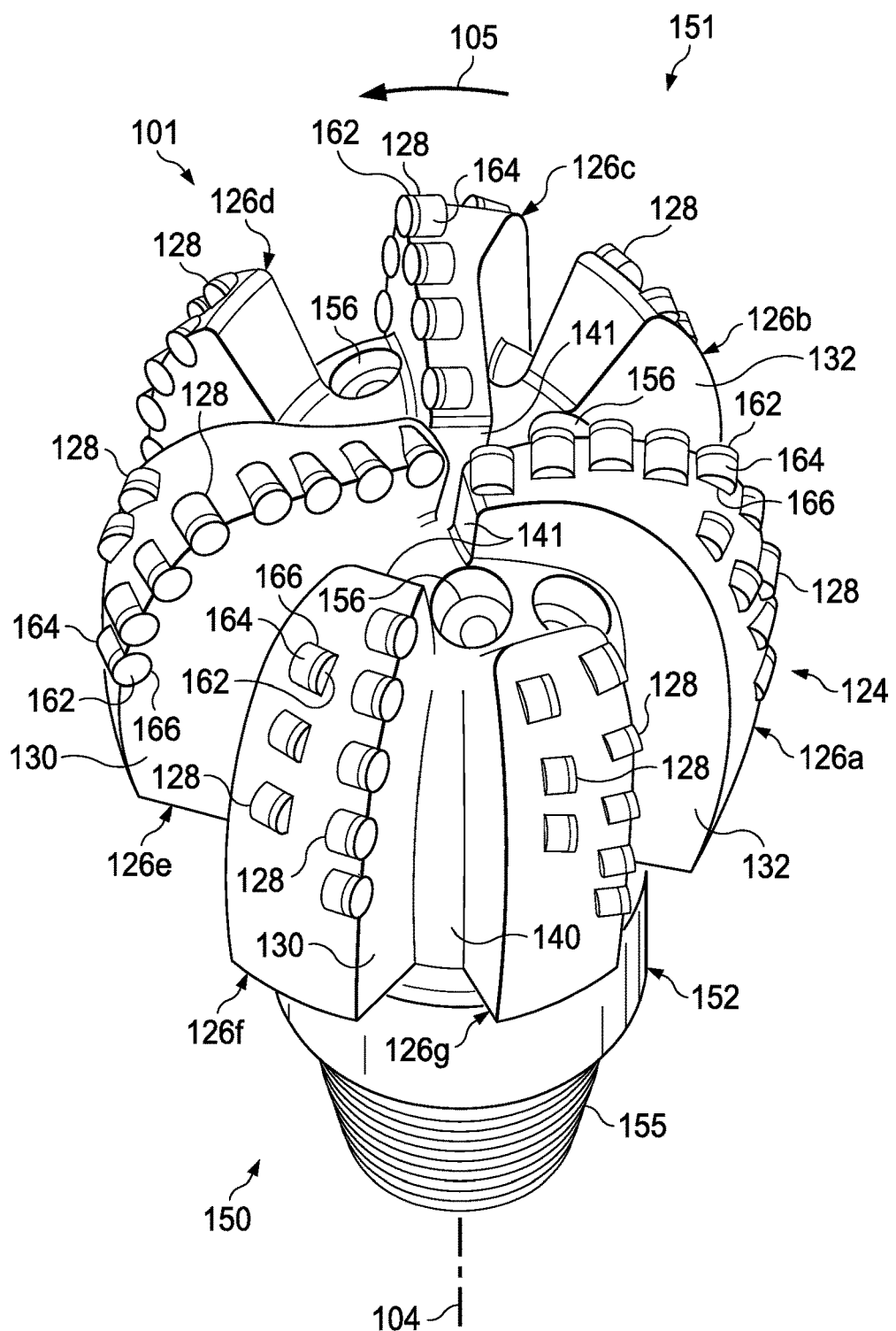
FIG. 2 illustrates an isometric view of a rotary drill bit oriented upwardly in a manner often used to model or design fixed cutter drill bits.

FIG. 2 illustrates an isometric view of rotary drill bit 101 oriented upwardly in a manner often used to model or design fixed cutter drill bits. Drill bit 101 may be any of various types of rotary drill bits, including fixed cutter drill bits, polycrystalline diamond compact (PDC) drill bits, drag bits, matrix drill bits, and/or steel body drill bits operable to form a wellbore (e.g., wellbore 114 as illustrated in FIG. 1) extending through one or more downhole formations. Drill bit 101 may be designed and formed in accordance with teachings of the present disclosure and may have many different designs, configurations, and/or dimensions according to the particular application of drill bit 101.

Drill bit 101 may include one or more blades 126 (e.g., blades 126a-126g) that may be disposed outwardly from exterior portions of rotary bit body 124 of drill bit 101. Blades 126 may be any suitable type of projections extending outwardly from rotary bit body 124. For example, a portion of blade 126 may be directly or indirectly coupled to an exterior portion of bit body 124, while another portion of blade 126 may be projected away from the exterior portion of bit body 124. Blades 126 formed in accordance with teachings of the present disclosure may have a wide variety of configurations including, but not limited to, substantially arched, generally helical, spiraling, tapered, converging, diverging, symmetrical, and/or asymmetrical. In some embodiments, one or more blades 126 may have a substantially arched configuration extending from proximate rotational axis 104 of drill bit 101. The arched configuration may be defined in part by a generally concave, recessed shaped portion extending from proximate bit rotational axis 104. The arched configuration may also be defined in part by a generally convex, outwardly curved portion disposed between the concave, recessed portion and exterior portions of each blade which correspond generally with the outside diameter of the rotary drill bit.

Each of blades 126 may include a first end disposed proximate or toward bit rotational axis 104 and a second end disposed proximate or toward exterior portions of drill bit 101 (e.g., disposed generally away from bit rotational axis 104 and toward uphole portions of drill bit 101). The terms "uphole" and "downhole" may be used to describe the location of various components of drilling system 100 relative to the bottom or end of wellbore 114 shown in FIG. 1. For example, a first component described as uphole from a second component may be further away from the end of wellbore 114 than the second component. Similarly, a first component described as being downhole from a second component may be located closer to the end of wellbore 114 than the second component.

Blades 126a-126g may include primary blades disposed about the bit rotational axis. For example, blades 126a, 126c, and 126e may be primary blades or major blades because respective first ends 141 of each of blades 126a, 126c, and 126e may be disposed closely adjacent to bit rotational axis 104 of drill bit 101. Blades 126a-126g may also include at least one secondary blade disposed between the primary blades. In the illustrated embodiment, blades 126b, 126d, 126f, and 126g on drill bit 101 may be secondary blades or minor blades because respective first ends 141 may be disposed on downhole end 151 of drill bit 101 a distance from associated bit rotational axis 104. The number and location of primary blades and secondary blades may vary such that drill bit 101 includes more or less primary and secondary blades. Blades 126 may be disposed symmetrically or asymmetrically with regard to each other and bit rotational axis 104 where the location of blades 126 may be based on the downhole drilling conditions of the drilling environment. Blades 126 and drill bit 101 may rotate about rotational axis 104 in a direction defined by directional arrow 105.

Each of blades 126 may have respective leading or front surfaces 130 in the direction of rotation of drill bit 101 and trailing or back surfaces 132 located opposite of leading surface 130 away from the direction of rotation of drill bit 101. Blades 126 may be positioned along bit body 124 such that they have a spiral configuration relative to bit rotational axis 104. Blades 126 may also be positioned along bit body 124 in a generally parallel configuration with respect to each other and bit rotational axis 104.

Blades 126 may include one or more cutting elements 128 disposed outwardly from exterior portions of each blade 126. For example, a portion of cutting element 128 may be directly or indirectly coupled to an exterior portion of blade 126 while another portion of cutting element 128 may be projected away from the exterior portion of blade 126. By way of example and not limitation, cutting elements 128 may be various types of cutters, compacts, buttons, inserts, and gage cutters satisfactory for use with a wide variety of drill bits 101. Although FIG. 2 illustrates two rows of cutting elements 128 on blades 126, drill bits designed and manufactured in accordance with the teachings of the present disclosure may have one row of cutting elements or more than two rows of cutting elements.

Cutting elements 128 may be any suitable device configured to cut into a formation, including but not limited to, primary cutting elements, back-up cutting elements, secondary cutting elements or any combination thereof. Cutting elements 128 may include respective substrates 164 with a layer of hard cutting material (e.g., cutting table 162) disposed on one end of each respective substrate 164. The hard layer of cutting elements 128 may provide a cutting surface that may engage adjacent portions of a downhole formation to form wellbore 114 as illustrated in FIG. 1. The contact of the cutting surface with the formation may form a cutting zone associated with each of cutting elements 128, as described in further detail with respect to FIGS. 4A-4D. For example, the cutting zone may be formed by the two-dimensional area, on the face of a cutting element, that comes into contact with the formation, and cuts into the formation. The edge of the portion of cutting element 128 located within the cutting zone may be referred to as the cutting edge of a cutting element 128.

Each substrate 164 of cutting elements 128 may have various configurations and may be formed from tungsten carbide or other suitable materials associated with forming cutting elements for rotary drill bits. Tungsten carbides may include, but are not limited to, monotungsten carbide (WC), ditungsten carbide ($W_2C$), macrocrystalline tungsten carbide and cemented or sintered tungsten carbide. Substrates may also be formed using other hard materials, which may include various metal alloys and cements such as metal borides, metal carbides, metal oxides and metal nitrides. For some applications, the hard cutting layer may be formed from substantially the same materials as the substrate. In other applications, the hard cutting layer may be formed from different materials than the substrate. Examples of materials used to form hard cutting layers may include polycrystalline diamond materials, including synthetic polycrystalline diamonds. Blades 126 may include recesses or bit pockets 166 that may be configured to receive cutting elements 128. For example, bit pockets 166 may be concave cutouts on blades 126.

Blades 126 may also include one or more depth of cut controllers (DOCCs) (not expressly shown) configured to control the depth of cut of cutting elements 128. A DOCC may include an impact arrestor, a back-up or second layer cutting element and/or a Modified Diamond Reinforcement (MDR). Exterior portions of blades 126, cutting elements 128 and DOCCs (not expressly shown) may form portions of the bit face.

Blades 126 may further include one or more gage pads (not expressly shown) disposed on blades 126. A gage pad may be a gage, gage segment, or gage portion disposed on exterior portion of blade 126. Gage pads may contact adjacent portions of a wellbore (e.g., wellbore 114 as illustrated in FIG. 1) formed by drill bit 101. Exterior portions of blades 126 and/or associated gage pads may be disposed at various angles (e.g., positive, negative, and/or parallel) relative to adjacent portions of generally vertical wellbore 114a. A gage pad may include one or more layers of hardfacing material.

Uphole end 150 of drill bit 101 may include shank 152 with drill pipe threads 155 formed thereon. Threads 155 may be used to releasably engage drill bit 101 with BHA 120 whereby drill bit 101 may be rotated relative to bit rotational axis 104. Downhole end 151 of drill bit 101 may include a plurality of blades 126a-126g with respective junk slots or fluid flow paths 140 disposed therebetween. Additionally, drilling fluids may be communicated to one or more nozzles 156.

Drill bit operation may be expressed in terms of depth of cut per revolution as a function of drilling depth. Depth of cut per revolution, or "depth of cut," may be determined by rate of penetration (ROP) and revolution per minute (RPM). ROP may represent the amount of formation that is removed as drill bit 101 rotates and may be in units of ft/hr. Further, RPM may represent the rotational speed of drill bit 101. For example, drill bit 101 utilized to drill a formation may rotate at approximately 120 RPM. Actual depth of cut ($\Delta$) may represent a measure of the depth that cutting elements cut into the formation during a rotation of drill bit 101. Thus, actual depth of cut may be expressed as a function of actual ROP and RPM using the following equation:

$$\Delta = ROP/(5*RPM).$$

Actual depth of cut may have a unit of in/rev.

The rate of penetration (ROP) of drill bit 101 is often a function of both weight on bit (WOB) and revolutions per minute (RPM). Drill string 103 may apply weight on drill bit 101 and may also rotate drill bit 101 about rotational axis 104 to form a wellbore 114 (e.g., wellbore 114a or wellbore 114b). For some applications a downhole motor (not expressly shown) may be provided as part of BHA 120 to also rotate drill bit 101. The drilling efficiency of drill bit 101 may depend on the location or configuration of cutting elements 128 or blades 126. Accordingly, a downhole drilling model may take into consideration the location, orientation and configuration cutting elements 128, blades 126, or other components of drill bit 101 in order to model interactions of downhole drilling tools with formations.

Figure 3A:
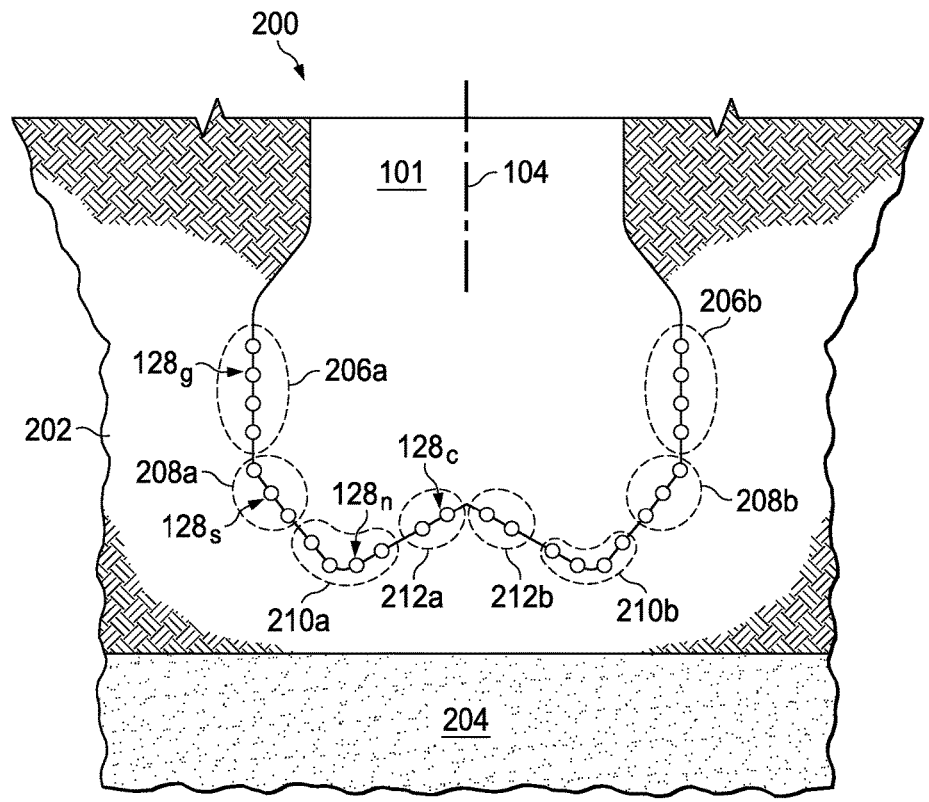
FIG. 3A illustrates a drawing in section and in elevation with portions broken away showing the drill bit of FIG. 2 drilling a wellbore through a first downhole formation and into an adjacent second downhole formation.

FIG. 3A illustrates a drawing in section and in elevation with portions broken away showing drill bit 101 of FIG. 2 drilling a wellbore through a first downhole formation and into an adjacent second downhole formation. Exterior portions of blades (not expressly shown in FIG. 3A) and cutting elements 128 may be projected rotationally onto a radial plane to form bit face profile 200. In the illustrated embodiment, formation layer 202 may be described as "softer" or "less hard" when compared to downhole formation layer 204. As shown in FIG. 3A, exterior portions of drill bit 101 that contact adjacent portions of a downhole formation may be described as a "bit face." Bit face profile 200 of drill bit 101 may include various zones or segments. Bit face profile 200 may be substantially symmetric about bit rotational axis 104 due to the rotational projection of bit face profile 200, such that the zones or segments on one side of rotational axis 104 may be substantially similar to the zones or segments on the opposite side of rotational axis 104.

For example, bit face profile 200 may include a gage zone 206a located opposite a gage zone 206b, a shoulder zone 208a located opposite a shoulder zone 208b, a nose zone 210a located opposite a nose zone 210b, and a cone zone 212a located opposite a cone zone 212b. The cutting elements 128 included in each zone may be referred to as cutting elements of that zone. For example, cutting elements $128_g$ included in gage zones 206 may be referred to as gage cutting elements, cutting elements $128_s$ included in shoulder zones 208 may be referred to as shoulder cutting elements, cutting elements $128_n$ included in nose zones 210 may be referred to as nose cutting elements, and cutting elements $128_c$ included in cone zones 212 may be referred to as cone cutting elements.

Cone zones 212 may be generally convex and may be formed on exterior portions of each blade (e.g., blades 126 as illustrated in FIG. 1) of drill bit 101, adjacent to and extending out from bit rotational axis 104. Nose zones 210 may be generally convex and may be formed on exterior portions of each blade of drill bit 101, adjacent to and extending from each cone zone 212. Shoulder zones 208 may be formed on exterior portions of each blade 126 extending from respective nose zones 210 and may terminate proximate to a respective gage zone 206. As shown in FIG. 3A, the area of bit face profile 200 may depend on cross-sectional areas associated with zones or segments of bit face profile 200 rather than on a total number of cutting elements, a total number of blades, or cutting areas per cutting element.

Figure 3B:
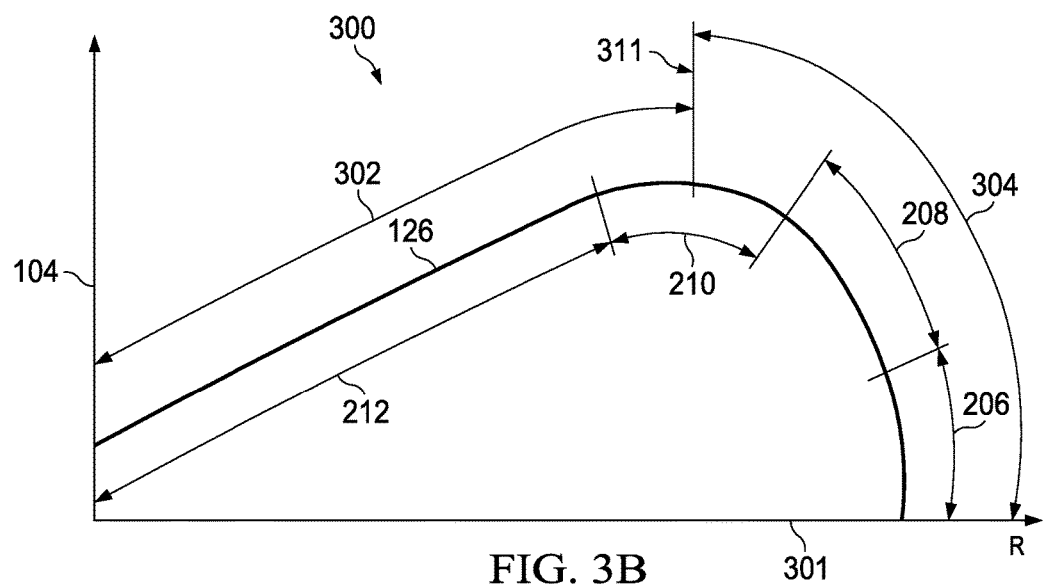
FIG. 3B illustrates a blade profile that represents a cross-sectional view of a blade of a drill bit.

FIG. 3B illustrates blade profile 300 that represents a cross-sectional view of blade 126 of drill bit 101. Blade profile 300 includes cone zone 212, nose zone 210, shoulder zone 208 and gage zone 206 as described above with respect to FIG. 2. Cone zone 212, nose zone 210, shoulder zone 208 and gage zone 206 may be based on their location along blade 126 with respect to rotational axis 104 and horizontal reference line 301 that indicates a distance from rotational axis 104 in a plane perpendicular to rotational axis 104. A comparison of FIGS. 3A and 3B shows that blade profile 300 of FIG. 3B is upside down with respect to bit face profile 200 of FIG. 3A.

Blade profile 300 may include inner zone 302 and outer zone 304. Inner zone 302 may extend outward from rotational axis 104 to nose point 311. Outer zone 304 may extend from nose point 311 to the end of blade 126. Nose point 311 may be the location on blade profile 300 within nose zone 210 that has maximum elevation as measured by bit rotational axis 104 (vertical axis) from reference line 301 (horizontal axis). A coordinate on the graph in FIG. 3B corresponding to rotational axis 104 may be referred to as an axial coordinate or position. A coordinate on the graph in FIG. 3B corresponding to reference line 301 may be referred to as a radial coordinate or radial position that may indicate a distance extending orthogonally from rotational axis 104 in a radial plane passing through rotational axis 104. For example, in FIG. 3B rotational axis 104 may be placed along a z-axis and reference line 301 may indicate the distance (R) extending orthogonally from rotational axis 104 to a point on a radial plane that may be defined as the ZR plane.

FIGS. 3A and 3B are for illustrative purposes only and modifications, additions or omissions may be made to FIGS. 3A and 3B without departing from the scope of the present disclosure. For example, the actual locations of the various zones with respect to the bit face profile may vary and may not be exactly as depicted.

FIGS. 4A-4D illustrate cutting edges 406 and cutting zones 404 of various cutting elements 402 disposed along a blade 400, as modeled by a downhole drilling tool model. Cutting zones 404 may be formed by the two-dimensional areas, on the faces of the respective cutting elements 402, that come into contact with the formation, and cut into the formation. Cutting edges 406 may be defined by the edges of the portions of cutting elements 402 located within cutting zones 404. The location and size of cutting zones 404 (and consequently the location and size of cutting edges 406) may depend on factors including the ROP and RPM of the bit, the size of cutting elements 402, and the location and orientation of cutting elements 402 along the blade profile of blade 400, and accordingly the bit face profile of the drill bit. Further, as described in more detail below with reference to FIGS. 13A-B, the shape of a cutting zone 404 may depend on the radial position of the corresponding cutting element, and whether that radial position overlaps with the radial positions of other cutting elements.

Figure 4A:
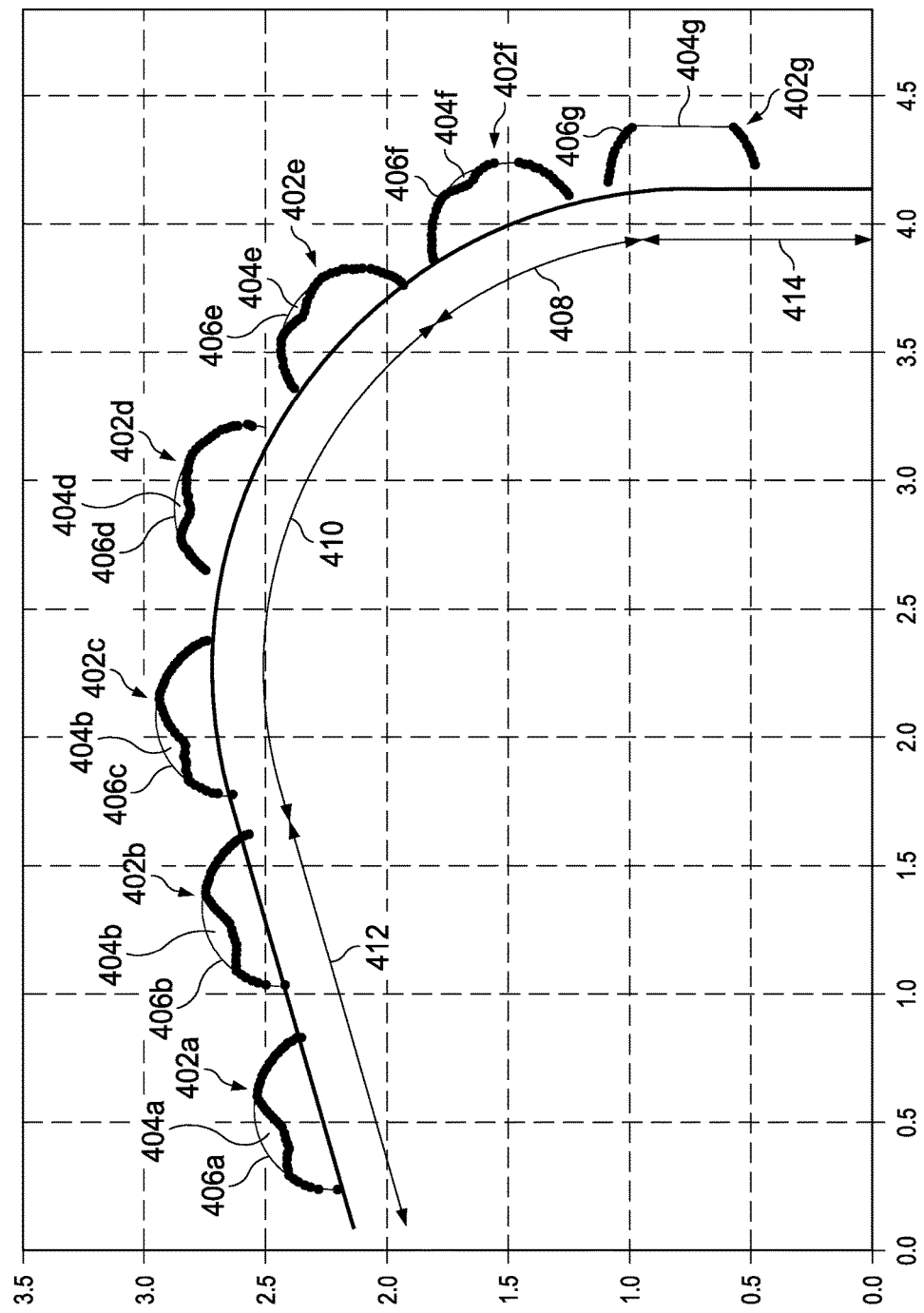

FIG. 4A illustrates a graph of a profile of blade 400 indicating radial and axial locations of cutting elements 402a-402g along blade 400. The vertical axis ("Z") depicts the axial position of blade 400 along a bit rotational axis and the horizontal axis ("R") depicts the radial position of blade 400 from the bit rotational axis in a radial plane passing through the bit rotational axis. Blade 400 may be substantially similar to one of blades 126 described with respect to FIGS. 1-3 and cutting elements 402 may be substantially similar to cutting elements 128 described with respect to FIGS. 1-3. In the illustrated embodiment, cutting elements 402a-402b may be located within a cone zone 412 of blade 400 and cutting elements 402c-402e may be located within a nose zone 410 of blade 400. Additionally, cutting elements 402f may be located within a shoulder zone 408 of blade 400 and cutting element 402g may be located within a gage zone 414 of blade 400. Cone zone 412, nose zone 410, shoulder zone 408 and gage zone 414 may be substantially similar to cone zone 212, nose zone 210, shoulder zone 208 and gage zone 206, respectively, described with respect to FIGS. 3A and 3B.

FIG. 4A illustrates cutting zones 404a-404g, with each cutting zone 404 corresponding with a respective cutting element 402. As mentioned above, each cutting element 402 may have a cutting edge 406 located within a cutting zone 404. From FIG. 4A it can be seen that the cutting zone 404 of each cutting element 402 may be based on the axial and radial locations of the cutting element 402 on blade 400, which may be related to the various zones of blade 400.

Figure 4B:
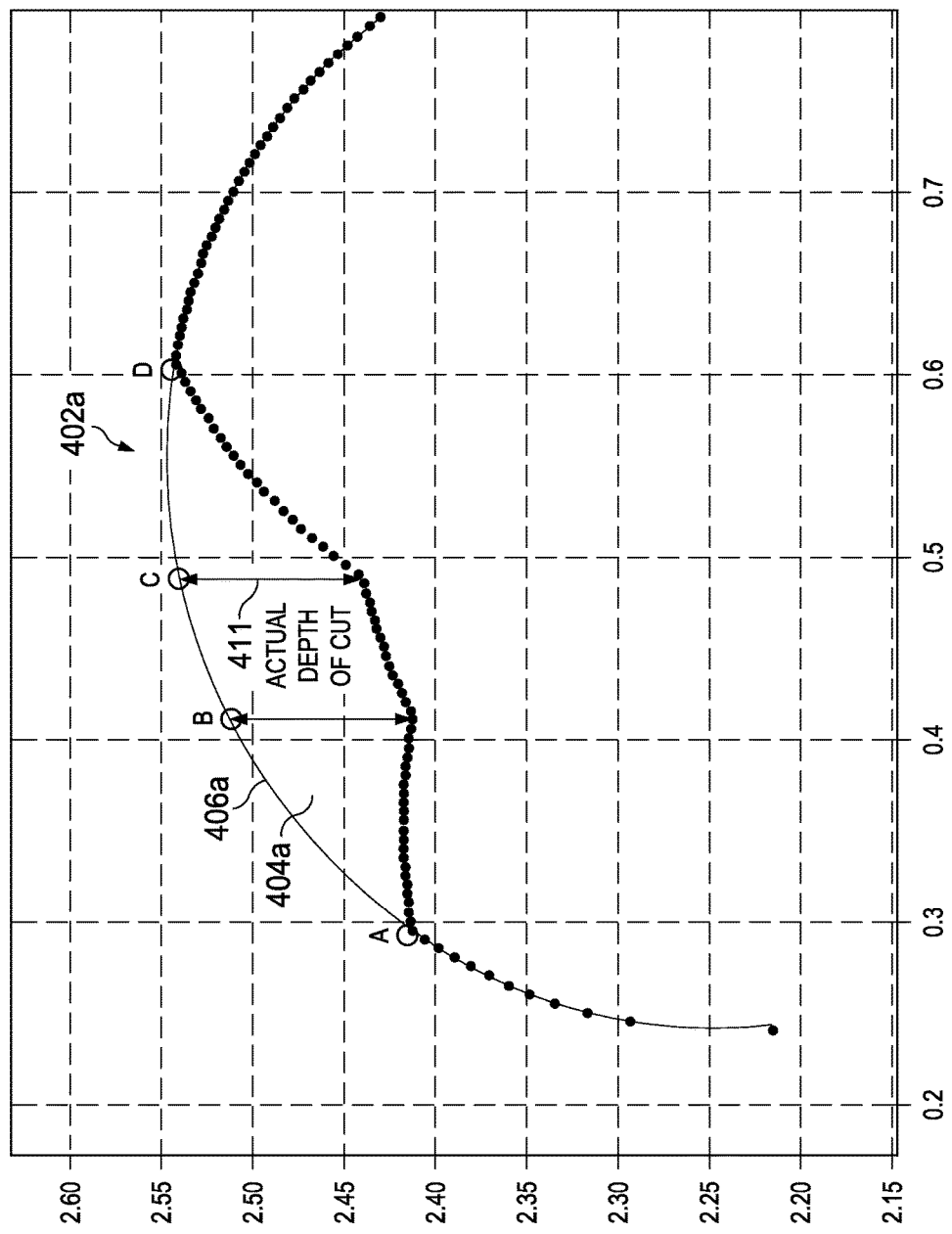

FIG. 4B illustrates an exploded graph of cutting element 402a of FIG. 4A to further detail cutting zone 404a and cutting edge 406a associated with cutting element 402a. From FIG. 4A it can be seen that cutting element 402a may be located in cone zone 412. Cutting zone 404a may be based at least partially on cutting element 402a being located in cone zone 412 and having axial and radial positions corresponding with cone zone 412. As mentioned above, cutting edge 406a may be the edge of the cutting surface of cutting element 402a that is located within cutting zone 404a. As shown in FIG. 4B, actual depth of cut 411 at different points within cutting zone 404a may depend on the shape of cutting zone 404a.

FIG. 4C illustrates an exploded graph of cutting element 402e of FIG. 4A to further detail cutting zone 404e and cutting edge 406e associated with cutting element 402e. From FIG. 4A it can be seen that cutting element 402e may be located in nose zone 410. Cutting zone 404e may be based at least partially on cutting element 402e being located in nose zone 410 and having axial and radial positions corresponding with nose zone 410. As shown in FIG. 4C, actual depth of cut 411 at different points within cutting zone 404e may depend on the shape of cutting zone 404e.

FIG. 4D illustrates an exploded graph of cutting element 402f of FIG. 4A to further detail cutting zone 404f and cutting edge 406f associated with cutting element 402f. From FIG. 4A it can be seen that cutting element 402f may be located in shoulder zone 408. Cutting zone 404f may be based partially on cutting element 402f being located in shoulder zone 408 and having axial and radial positions corresponding with shoulder zone 408.

An analysis of FIG. 4A and a comparison of FIGS. 4B-4D reveal that the locations of cutting zones and the shapes 404 of cutting elements 402 may vary at least in part on the axial and radial positions of cutting elements 402 with respect to rotational axis 104. Accordingly, a downhole drilling model may take into consideration the location, orientation and configuration cutting elements 402 of a drill bit in order to incorporate interactions of downhole drilling tools with formations.

Figure 5A:
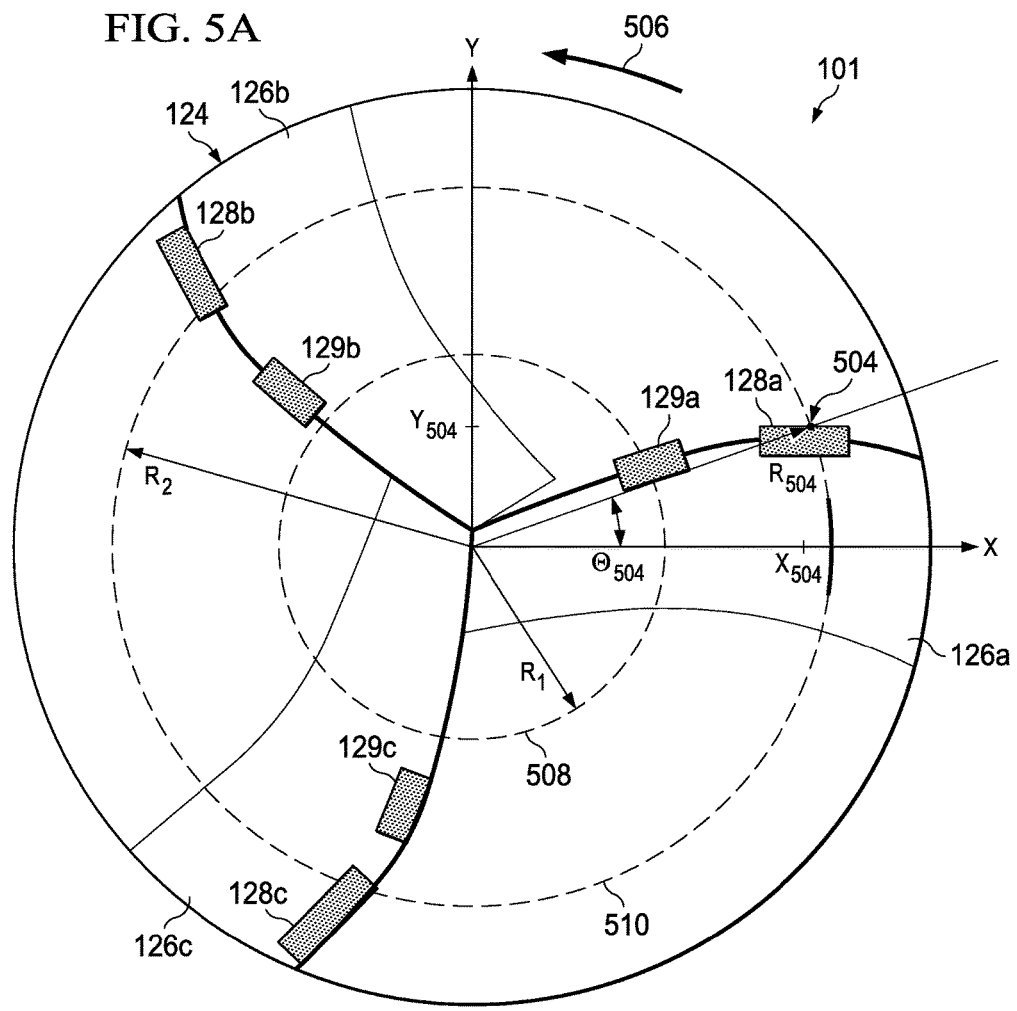
FIG. 5A is a top view of the drill bit 101 illustrating the face of a drill bit that may be designed and manufactured to provide an improved depth of cut control.
Figure 5B:
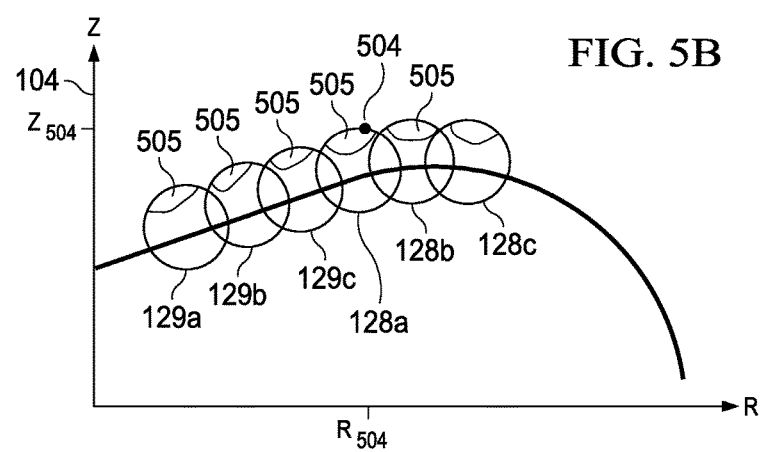
FIG. 5B illustrates the locations of cutting elements of the drill bit of FIG. 5A along the bit profile of the drill bit.

FIG. 5A is a top view of the drill bit 101 illustrating the face of a drill bit that may be designed and manufactured to provide an improved depth of cut control. FIG. 5B illustrates the locations of cutting elements of the drill bit of FIG. 5A along the bit profile of the drill bit.

To provide a frame of reference, FIG. 5A includes an x-axis and a y-axis and FIG. 5B includes a z-axis that may be associated with rotational axis 104 of drill bit 101 and a radial axis (R) that indicates the orthogonal distance from the center of bit 101 in the xy plane. Accordingly, a coordinate or position corresponding to the z-axis may be referred to as an axial coordinate or axial position of the bit face profile. Additionally, a location along the bit face may be described by x and y coordinates of an xy-plane substantially perpendicular to the z-axis. The distance from the center of bit 101 (e.g., rotational axis 104) to a point in the xy plane of the bit face may indicate the radial coordinate or radial position of the point on the bit face profile of bit 101. For example, the radial coordinate, r, of a point in the xy plane having an x coordinate, x, and a y coordinate, y, may be expressed by the following equation:

$$r = \sqrt{x^2 + y^2}$$

Additionally, a point in the xy plane may have an angular coordinate that may be an angle between a line extending from the center of bit 101 (e.g., rotational axis 104) to the point and the x-axis. For example, the angular coordinate (θ) of a point in the xy plane having an x-coordinate, x, and a y-coordinate, y, may be expressed by the following equation:

$$\theta = \arctan(y/x)$$

As a further example, a point 504 located on the cutting edge of cutting element 128a (as depicted in FIGS. 5A and 5B) may have an x-coordinate ($X_{504}$) and a y-coordinate ($Y_{504}$) in the xy plane that may be used to calculate a radial coordinate ($R_{504}$) of point 504 (e.g., $R_{504}$ may be equal to the square root of $X_{504}$ squared plus $Y_{504}$ squared). $R_{504}$ may accordingly indicate an orthogonal distance of point 504 from rotational axis 104. Additionally, point 504 may have an angular coordinate ($\theta_{504}$) that may be the angle between the x-axis and the line extending from rotational axis 104 to point 504 (e.g., $\theta_{504}$ may be equal to arctan ($X_{504}/Y_{504}$)). Further, as depicted in FIG. 5B, point 504 may have an axial coordinate ($Z_{504}$) that may represent a position along the z-axis that may correspond to point 504. It is understood that the coordinates are used for illustrative purposes only, and that any other suitable coordinate system or configuration, may be used to provide a frame of reference of points along the bit face and bit face profile of drill bit 101. Additionally, any suitable units may be used. For example, the angular position may be expressed in degrees or in radians.

Drill bit 101 may include bit body 124 with a plurality of blades 126 positioned along bit body 124. In the illustrated embodiment, drill bit 101 may include blades 126a-126c, however it is understood that drill bit 101 may include more or fewer blades 126. Blades 126 may include outer cutting elements 128 and inner cutting elements 129 disposed along blades 126. For example, blade 126a may include outer cutting element 128a and inner cutting element 129a, blade 126b may include outer cutting element 128b and inner cutting element 129b and blade 126c may include outer cutting element 128c and inner cutting element 129c.

As drill bit 101 rotates, cutting elements 128 and 129 may follow a rotational path indicated by radial paths 508 and 510 of drill bit 101. Radial paths 508 and 510 may be defined by radial coordinates $R_1$ and $R_2$. $R_1$ may indicate the orthogonal distance from rotational axis 104 to the centers of cutting elements 129 (with respect to the center of drill bit 101). $R_2$ may indicate the orthogonal distance from rotational axis 104 to the centers of cutting elements 128 (with respect to the center of drill bit 101).

Modifications, additions or omissions may be made to FIGS. 5A and 5B without departing from the scope of the present disclosure. For example, the number of blades 126 and cutting elements 128 may vary according to the various design constraints and considerations of drill bit 101.

Figure 6A:
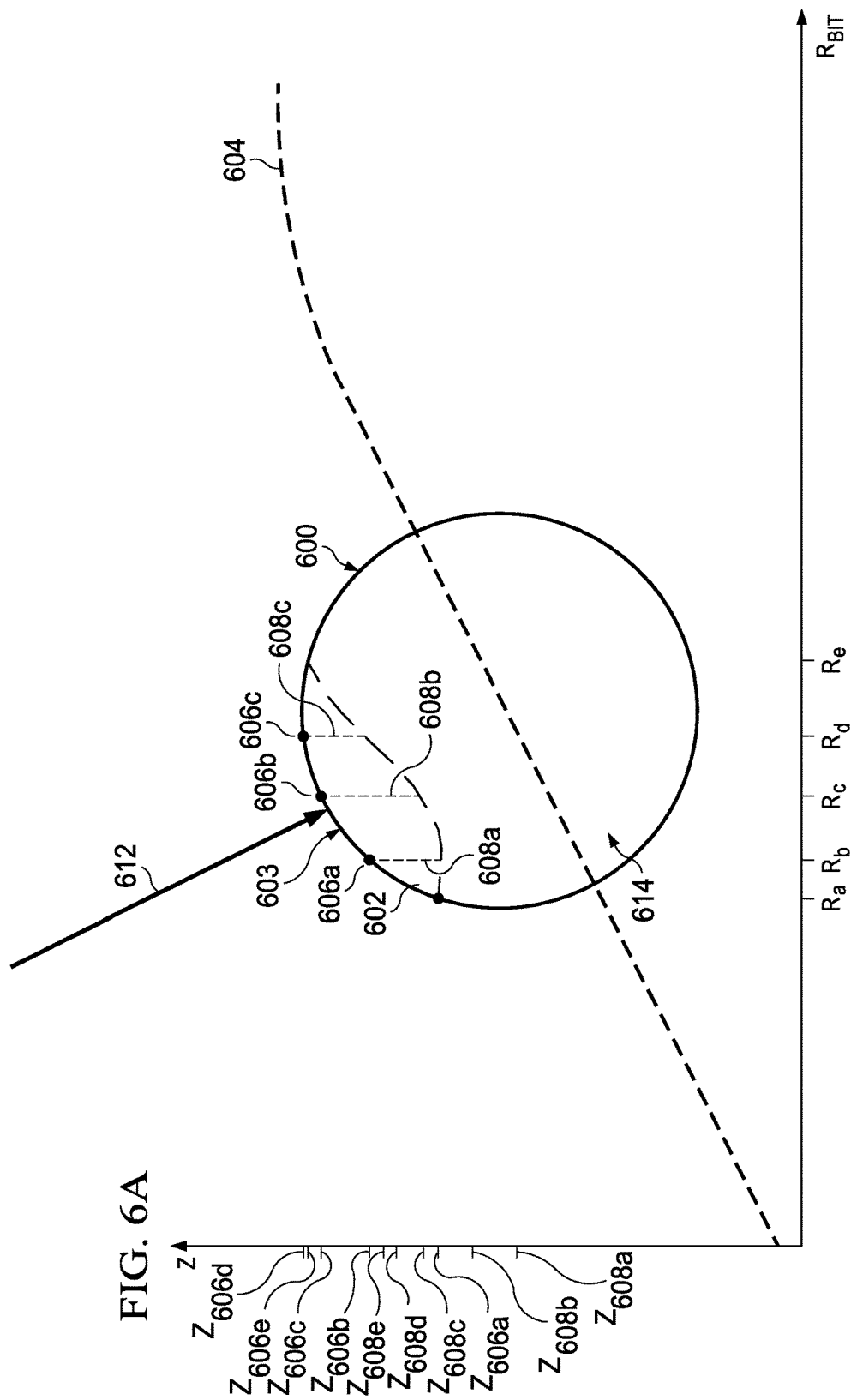
FIG. 6A illustrates a graph of a bit face profile of a cutting element.

FIG. 6A illustrates a graph of a bit face profile of a cutting element 600. The coordinate system used in FIG. 6A may be substantially similar to that described with respect to FIGS. 5A and 5B. Therefore, the rotational axis of the drill bit corresponding with FIG. 6A may be associated with the z-axis of a Cartesian coordinate system to define an axial position with respect to the drill bit. Additionally, an xy plane of the coordinate system may correspond with a plane of the bit face of the drill bit that is substantially perpendicular to the rotational axis. Coordinates on the xy plane may be used to define radial and angular coordinates associated with the drill bit of FIG. 6A.

FIG. 6A illustrates the axial and radial coordinates of cutting element 600 and cutting zone 602 (and its associated cutting edge 603) of cutting element 600. Cutting edge 603 of cutting element 600 that corresponds with cutting zone 602 may be divided according to cutlets 606a-606c that have radial and axial positions as depicted in FIG. 6A. Each cutlet may have an associated depth of cut 608a-608c.

Figure 6B:
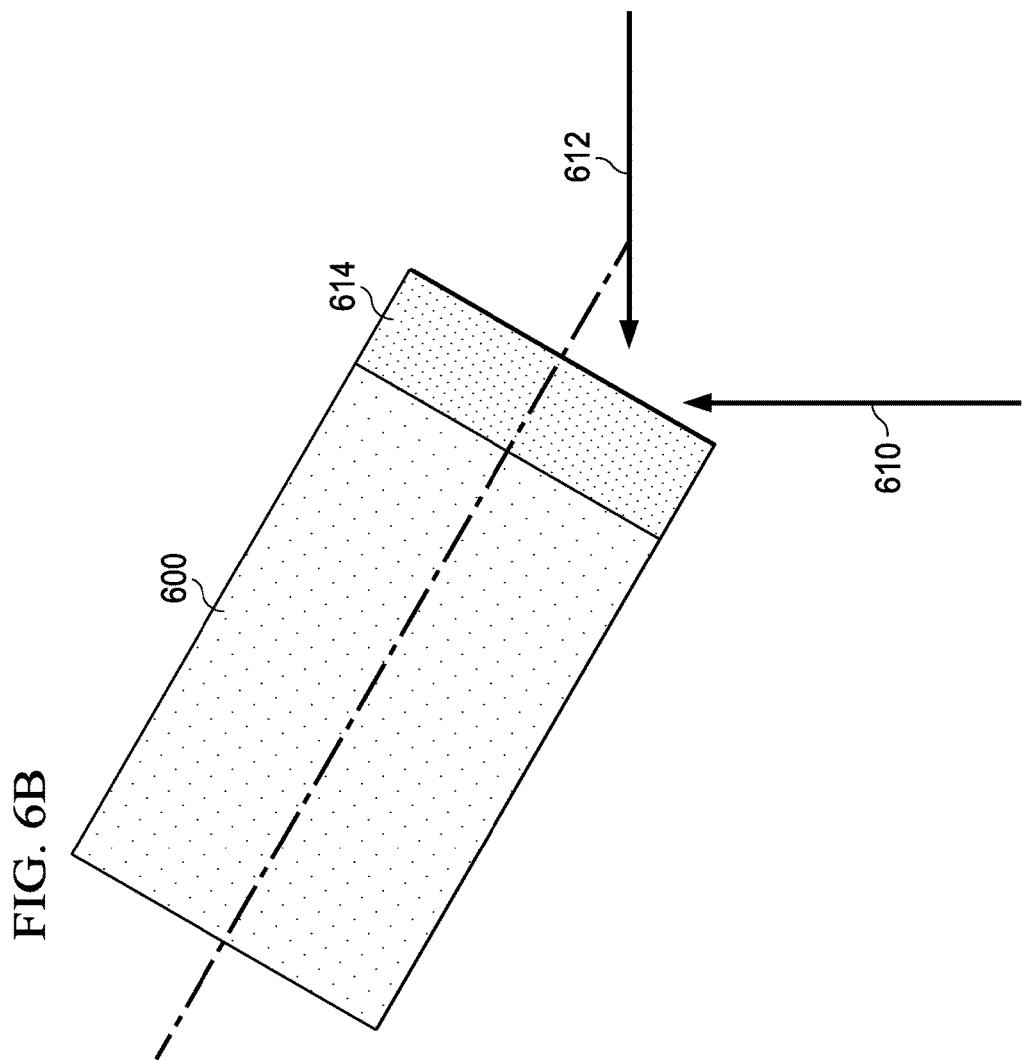
FIG. 6B illustrates a cross sectional view of an exemplary cutting element, including associated drilling forces.

Downhole drilling tool models may be used to model efficiency of drill bits. Downhole drilling tool models may calculate at least two forces acting on each cutting element: cutting force ($F_c$) and penetration force ($F_p$). FIG. 6B illustrates a cross sectional view of an exemplary cutting element, including associated drilling forces. As shown in FIGS. 6A and 6B, penetration force 610 may act in the direction of bit axis. As shown in FIG. 6B, cutting force 612 may act perpendicularly to penetration force 610, in the direction of cutting face 614. Cutting force 612 and penetration force 610 may depend on cutting element geometry coefficients ($K_c$) and ($K_p$), which may be functions of a back rake angle, side rake angle and profile angle of cutting element 600. Further, cutting force 612 and penetration force 610 may additionally depend on rock compressive strength ($\sigma$) and area (A) of cutting zone 602. Cutting force 612 and penetration force 610 may be calculated as expressed by the equations:

$$F_c = K_c * \sigma * A$$

$$F_p = K_p * \sigma * A$$

However more complex models may be utilized if, for example, cutting areas of cutting elements, cutting element geometry coefficients, or rock compressive strength at the location of a cutting element vary between cutting elements. For example, as explained in further detail below with reference to FIGS. 13A-B and 14A-B, a more complex model may be utilized in order to consider the effect that different shapes of the cutting zones of respective cutting elements may have on the respective cutting forces ($F_c$) for those cutting elements.

A downhole drilling model may receive as inputs (typically as an ASCII file), a description of cutting elements locations, cutlet locations, rake angles, formation compressive strength, rate of penetration (ROP), weight on bit (WOB), and/or rotations per minute (RPM). Downhole drilling models may utilize an integration method for developing cutting element engagement geometries and bottom hole pattern, taking into account locations of each cutting element 600 and cutlet 606 in a three dimensional coordinate system. Once an engagement of each cutlet 606 has been determined across an drill bit face, cutting forces and penetration forces may be calculated and summed for each individual cutting element. Vertical components of forces may be summed to estimate WOB. Cutting forces may be multiplied by their respective moment arms to compute bit torque (TOB).

Additionally, models of drilling efficiency of a drill bit may be evaluated in terms of mechanical specific energy ($E_s$). A drill bit with a lower mechanical specific energy may be referred to as a more efficient drill bit. Mechanical specific energy of a drill bit may be expressed as a function of WOB, TOB, RPM and ROP, and borehole cross-sectional area ($A_{bh}$) by the following equation:

$$E_s = (WOB/A_{bh}) + ((120 * \pi * RPM * TOB)/(A_{bh} * ROP))$$

Accordingly, a downhole drilling model configured to calculate WOB and TOB may enable accurate modeling of mechanical specific energy, and consequently drill bit efficiency. Thus, according to teachings of the present disclosure, a downhole drilling model capable of modeling mechanical specific energy may be implemented.

Modifications, additions or omissions may be made to FIG. 6 without departing from the scope of the present disclosure. Although a specific number of cutlets and depths of cut are described, it is understood that any appropriate number may be used to configure analyze an efficiency of a cutting element or a drill bit.

FIG. 7 illustrates a cross sectional view of an exemplary cutting element 704 engaged with geological formation 702. As a drill bit, such as drill bit 101 discussed above with reference to FIG. 1, rotates around a rotational axis, cutting elements, such as cutting element 704, may contact a formation, such as formation 702. Rotation of drill bit 101 may apply forces to cutting element 704 that cause the cutting element to move across formation 702 laterally in direction 710. Direction 710 may lie in a plane substantially perpendicular to the bit rotational axis. As cutting element 704 engages with formation 702 by moving in direction 710, material in area 712 may be removed by cutting face 706 of cutting element 704.

Further, engagement of cutting element 704 with formation 702 may also remove material in front of cutting face 706. For example, the interaction of cutting element 704 with formation 702 may cause rock chip 708 to separate from formation 702. Rock chip 708 may be demarcated by crack trajectory 718. Crack trajectory 718 may begin at a point, corresponding to cutlet 724, along a cutting edge of cutting face 706. Crack trajectory 718 may follow a generally parabolic path to surface 726 of formation 702, reaching surface 726 at chip end 728. The shape of crack trajectory 718 may be based on a variety of factors. For example, the shape of crack trajectory 718 may depend on depth of cut of cutting element 704, the initial angle of crack trajectory 718 from cutting face 706, confining pressure, mud pressure, rock shear strength, whether formation 702 is in a brittle or ductile mode, or any other suitable drilling parameter or property of formation 702.

As depicted in FIG. 7, cutlet 724 may have depth of cut 714 ($\delta_{714}$). Each cutlet associated with a cutting zone of a cutting element, such as cutlets 606a-606c (as discussed above with reference to FIG. 6), may have a different depth of cut. Thus, each cutlet associated with a cutting element may have a different associated crack trajectory, and consequently may be associated with a different size of rock chip.

Because a particular drill bit may have a large number of cutting elements, each with a number of associated cutlets, it may be computationally intensive to model a parabolic crack trajectory for each rock chip. Accordingly, crack trajectories may be modeled as straight lines. FIG. 8 illustrates a modeled approximation of rock chip 808. Although a crack trajectory may have a generally parabolic shape, a rock chip may be modeled as having a triangular shape, such as, for example, modeled rock chip 808. For example, modeled rock chip 808 may have an associated modeled rock chip boundary 818. Modeled rock chip boundary 818 may be a straight line between cutlet 824 and rock chip end 828. By modeling a rock chip in this manner, instances of modeled rock chip 808 may be characterized by modeled depth of cut 814 and modeled rock chip angle 820. Modeled depth of cut 814 may be the distance along a line perpendicular to surface 826 between cutlet 824 and a line extending along surface 826 of formation 802. Modeled rock chip angle 820 may be the angle formed between modeled crack trajectory 818 and surface 826.

Under a given set of drilling parameters, rock chips may have similar rock chip angles. Thus, for a given set of drilling parameters, such as confining pressure, mud pressure, rock shear strength, depth of cut of a cutting element or any other suitable drilling parameter, each rock chip may be assumed to have the same modeled rock chip angle. Modeled rock chip angle 820 ($\psi$) may be empirically determined from lab tests or field tests by operating a drill bit under a variety of drilling parameters and collecting and measuring rock chips. For example, chip length 822 (L) and chip height 810 ($\delta_c$) may be measured. Chip height 810 may be calculated based upon depth of cut 814 ($\delta$) of an associated cutlet, back rake angle 816 ($\beta$), and modeled rock chip angle 820 ($\psi$). Chip angle $\psi$ may also be calculated from cutter back rake angle and cutter-rock interface friction angle. As one example, modeled rock chip angle 820 ($\psi$) may be expressed by the following equation:

$$\psi = \arctan(\delta_c/L)$$

However, rock chips may only be created when depth of cut 814 is greater than a critical depth of cut. Critical depth of cut may depend on confining pressure, mud pressure, rock shear strength, or any other suitable drilling parameter or formation property. Critical depth of cut may numerically be modeled or observed in laboratory or field testing. A critical depth of cut for a particular type of rock may be determined by laboratory tests under controlled conditions.

Once the properties of two dimensional rock chips, such as modeled rock chip 808 (discussed above with reference to FIG. 8), have been determined, three dimensional rock chips may be modeled. As cutting elements engage with formations, three dimensional rock chips of varying sizes may separate from formations in advance of the cutting edges of the cutting elements. Variations in sizes of rock chips may correlate with variations in the depth of cut associated with different cutlets of the cutting elements. For example, each cutlet associated with a cutting element may have a different depth of cut. Accordingly, as described with reference to FIGS. 7 and 8, cutlets may be associated with two dimensional rock chips of varying sizes. Three dimensional rock chips may be modeled as aggregations of these two dimensional rock chips associated with cutlets of a cutting element. Thus, three dimensional rock chips may consist of groups of adjacent two dimensional rock chips associated with cutlets of a cutting element.

FIGS. 9A and 9B illustrate an exemplary modeled three dimensional rock chip. FIG. 9A illustrates a three dimensional rock chip divided into an exemplary group of cutlets. Two or more cutlets associated with a cutting area of a cutting element may generate rock chips of varying sizes according to a depth of cut. For example, cutting element 902, as shown in FIG. 9A, may include cutting zone 908. Cutting zone 908 may include any number of cutlets 904a-904k. Each cutlet 904a-904k may include an associated depth of cut ($\delta$). Under a particular set of drilling parameters, critical depth of cut 910 may be determined. Accordingly, if any depth of cut of cutlets 904a-904k is greater than critical depth of cut 910, two dimensional rock chips may be formed when cutting element 902 contacts a formation during a drilling operation. Rock chips associated with cutlets 904a-904k may be modeled as two dimensional rock chips as previously discussed in conjunction with FIGS. 7 and 8. For example, for a particular cutting element, if the maximum modeled depth of cut associated with cutlets 904a-904k is less than critical depth of cut 910, no two dimensional rock chips associated with cutting element 902 may be modeled. Alternatively, if the maximum modeled depth of cut associated with a particular cutting element 902 is greater than critical cutting depth 910, a rock chip associated with each particular cutlets 904a-904k may be modeled.

FIG. 9B illustrates exemplary two dimensional rock chip lengths for an associated three dimensional rock chip. As shown in FIG. 9A, exemplary cutlets 904a, 904j and 904k include an associated depth of cut less than critical depth of cut 910. Accordingly, cutlets 904a, 904j and 904k do not have associated modeled rock chip lengths. As further shown in FIG. 9A, cutlets 904b-904i include an associated depth of cut greater than critical depth of cut 910. Accordingly, rock chips associated with cutlets 904b-904i include associated modeled rock chip lengths 906b-906i. Modeled rock chip lengths 906*b*-906*i* may extend substantially perpendicularly from cutting face 912 of cutting element 902. Alternatively, if the modeled depth of cut associated with a particular cutlet 904 is greater than critical depth of cut 910, modeled rock chip lengths 906*b*-906*i* ($L_x$) may be calculated for a particular set of drilling parameters as a function of chip height ($\delta_x$) and rock chip angle ($\psi$), as expressed by the following equation:

$$L_x = \delta_x / \tan(\psi)$$

After rock chips associated with cutlets 904*b*-904*i* are modeled as extending from cutting face 912, three dimensional areas encompassing groups of adjacent two dimensional rock chips may be referred to as three dimensional rock chips. A combination of a set of two dimensional rock chips associated with cutlets of a single cutting element may be referred to as a three dimensional rock chip.

Three dimensional rock chips associated with cutting elements of a drill bit may be incorporated into a downhole drilling tool model. A model of an initial borehole bottom may be generated by modeling a full revolution of a drill bit without axial penetration. Subsequently, the borehole bottom may be divided into a grid using a polar coordinate system. The grid may be formed using constant steps ($d_r$) in the radial direction, and constant steps ($d_\theta$) in the circumferential direction. Each grid point may include an associated formation height measured along a z-axis that may be associated with rotational axis of a drill bit, such as the z-axis shown in FIG. 5. The interactions of a drill bit with a formation may be analyzed by modeling incremental rotations of the drill bit around a rotational axis in discrete time steps. The rotational axis may be the bit rotational axis, such as bit rotational axis 104, discussed with reference to FIGS. 1, 2 and 3A. A drill bit may also rotate around any other suitable axis. At each incremental time step, locations of each cutting elements and associated cutlets may be updated. If an updated location of a cutlet indicates that the cutlet cuts into the borehole bottom during a time step, the associated formation height may be updated according to the depth of the cut of the cutlet.

Figure 10:
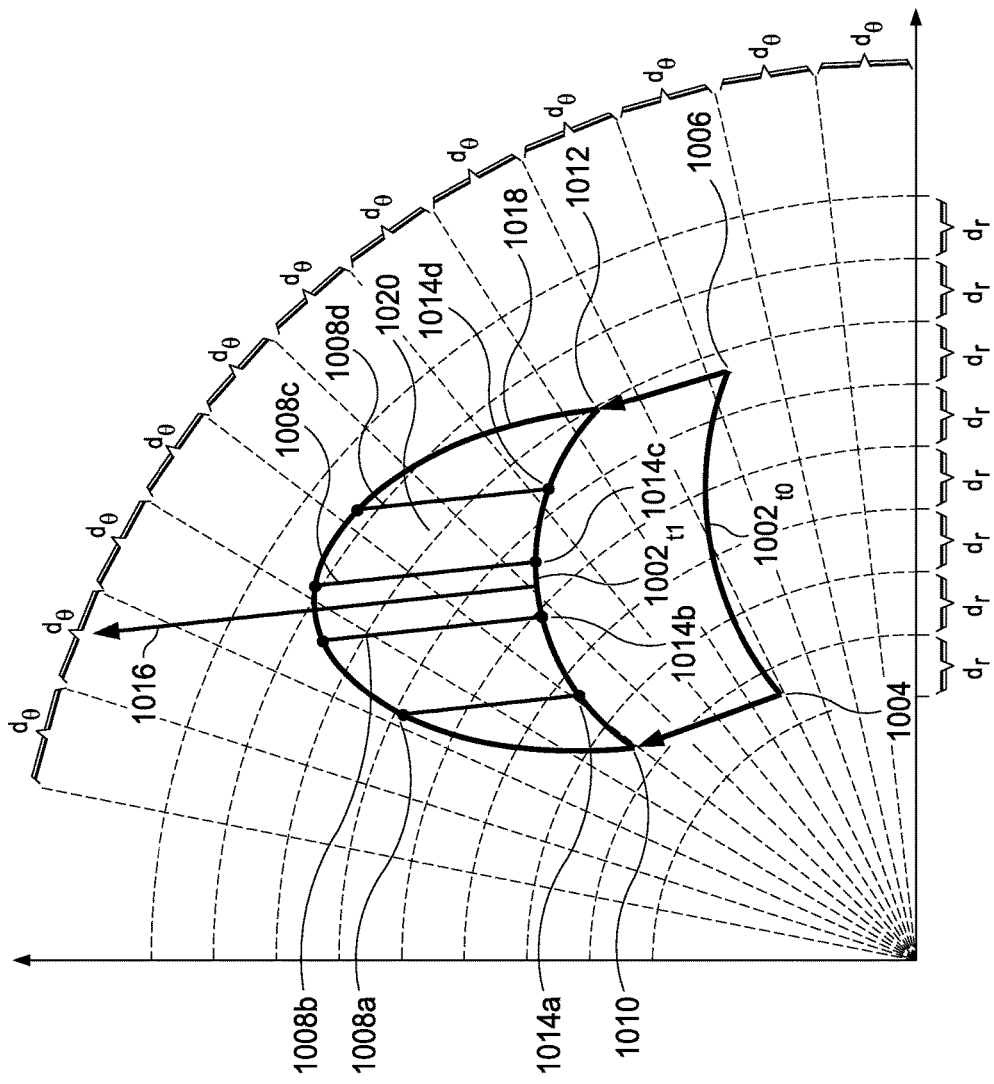
FIG. 10 illustrates an exemplary boundary of a rock chip created by a single cutting element.

FIG. 10 illustrates an exemplary boundary of a rock chip created by a single cutting element. At time $t_0$, a downhole drilling model may indicate that an exemplary cutting element 1002$_{t0}$ is located along an arc between endpoints 1004 and 1006. At time $t_1$, a downhole drilling model may further indicate that exemplary cutting element 1002$_{t1}$ is located along an arc between endpoints 1010 and 1012. At time $t_1$, cutting element 1002$_{t1}$ may be divided into associated cutlets 1014*a*-1014*d*. Existing downhole drilling models may update formation heights only in areas bounded by the positions of cutting element 1002 at times $t_0$ and $t_1$. For example, existing downhole drilling models may only analyze drill bit interactions with formations in the area bounded by endpoints 1004, 1006, 1010, and 1012. However, in accordance with teachings of the present disclosure, downhole drilling models may be supplemented by further analyzing drill bit interactions with formations in advance of the cutting elements by, for example, modeling the creation or removal of three dimensional rock chips.

For example, after the downhole drilling model indicates locations of cutting element 1002 and associated cutlets 1014*a*-1014*d*, the downhole drilling model may model a removal of three dimensional rock chip 1020. In accordance with the discussions associated with FIGS. 7, 8, 9A, and 9B, a shape of three dimensional rock chip 1020 may be modeled by analyzing two dimensional rock chips associated with cutlets 1014*a*-1014*d*.

For each cutlet 1014*a*-1014*d*, a downhole drilling model may indicate an associated depth of cut. Further, based on modeled drilling parameters, a critical depth of cut may be determined. Accordingly, for each cutlet 1014*a*-1014*d*, if an associated depth of cut is greater than the critical depth of cut, a two dimensional rock chip may be modeled. Rock chip lengths 1008*a*-1008*d* may be determined based on modeled drilling parameters such as a modeled rock chip angle. Rock chip lengths 1008*a*-1008*d* may be calculated according to the techniques discussed in conjunction with, for example, FIGS. 9A and 9B.

A downhole drilling model may indicate cutting direction 1016 at time $t_1$. Accordingly, rock chips may be modeled as originating at coordinates associated with cutlets 1014*a*-1014*d* and running substantially parallel to cutting direction 1016 along rock chip lengths 1008*a*-1008*d*. Coordinates of cutlets 1014*a*-1014*d* fall between grid points, and a downhole drilling model may analyze features of a rock chip based on interstitial cutter coordinates. In the same or other embodiments, coordinates of cutlets 1014*a*-1014*d* may be interpolated to correspond to grid points. Chip boundary 1018 may be selected along a path between endpoints 1010 and 1012 that encompasses the ends of rock chip lengths 1008*a*-1008*d*. Each grid point within the area circumscribed by chip boundary 1018 and cutting element 1002$_{t1}$ may be assigned a new borehole bottom depth based upon locations and geometries of modeled rock chips. For example, modeled heights of the borehole bottom assigned to grid points associated with cutlets 1014*a*-1014*d* may be reduced by the depth of cut of the associate cutlets. Further, modeled heights of the borehole bottom assigned to grid points located along chip boundary 1018 may remain unaltered. Additionally, modeled heights of the borehole bottom assigned to grid points along rock chip lengths 1008*a*-1008*d* may be reduced by modeling a crack trajectory as a straight line between cutlets 1014*a*-1014*d* and chip boundary 1018 and linearly interpolating rock chip heights along rock chip lengths 1008*a*-1008*d*. In order to expand the single cutting element model, discussed in conjunction with FIG. 10, into a full bit model, a downhole drilling model may repeat the analysis associated with FIG. 10 for each cutting element on a drill bit at each time step.

FIG. 10 is for illustrative purposes only and modifications, additions or omissions may be made to FIG. 10 without departing from the scope of the present disclosure. For example, although FIG. 10 is discussed using a polar coordinate system, it will be understood that any suitable coordinate system may be used, such as a Cartesian coordinate system or a spherical coordinate system.

Figure 11:
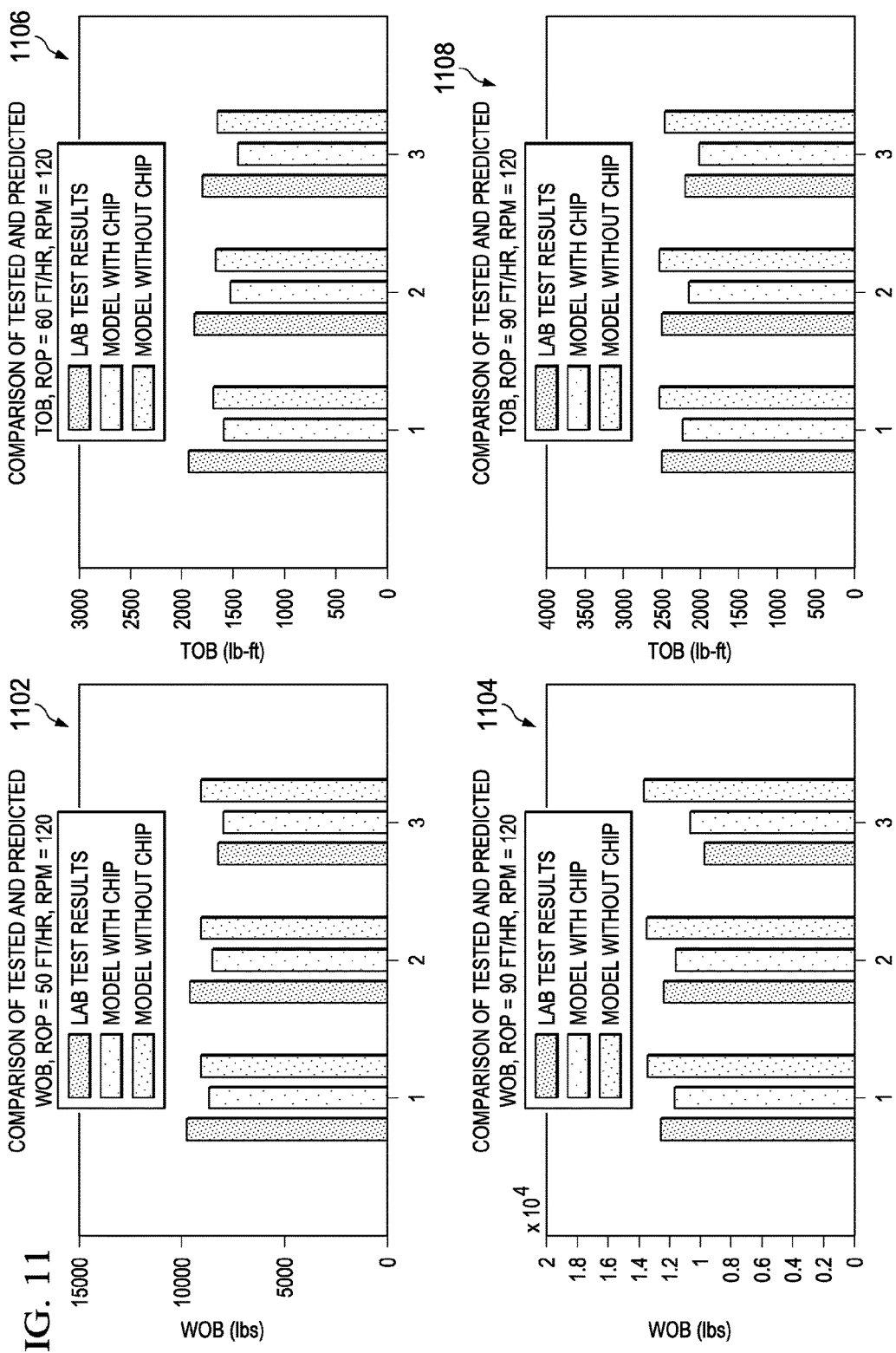
FIG. 11 illustrates exemplary modeled and measured drill bit force data.

Downhole drilling tool models including analysis of three dimensional rock chips may be used to analyze mechanical specific energy of drill bits or drill bit designs. Downhole drilling tool models may be used to calculate simulated bit forces associated with a drill bit. For example a downhole drilling model may calculate WOB, TOB, or lateral bit forces. FIG. 11 illustrates exemplary modeled and measured drill bit force data. Three bits were tested in a laboratory, and WOB and TOB measurements were recorded. Further, each of the three bits were modeled with two different models: a downhole drilling model including three dimensional bit-rock chip interaction, and a downhole drilling model without three dimensional bit-rock chip interaction. Each graph in FIG. 11 shows three groups of data, where each group is associated with a drill bit (numbered 1-3). Each column of data associated with a drill bit represents a measured or modeled drilling parameter as indicated by an associated legend. Graphs 1102 and 1104 illustrate modeled and measured WOB data. In both graphs 1102 and 1104, laboratory measured bit 3 is the most efficient bit, while bit 1 is the least efficient. The downhole drilling model including an analysis of three dimensional rock chips shows the same relative relationship between bits 1, 2, and 3. However, the downhole drilling model without an analysis of three dimensional rock chips predicts that all three bits should perform almost identically. Similarly, graphs 1106 and 1108 illustrate modeled and measured TOB data. In both graph 1106 and 1108, laboratory measured bit 3 is the most efficient bit, while bit 1 is the least efficient. The downhole drilling model including an analysis of three dimensional rock chips shows the same relative relationship between bits 1, 2, and 3. However, the downhole drilling model without an analysis of three dimensional rock chips predicts that all three bits should perform almost identically. Thus, downhole drilling models including an analysis of three dimensional rock chips may be used to analyze and model drilling efficiencies of various drill bits or drill bit designs.

To further improve the analysis and modeling of drilling efficiencies of various drill bits or drill bit designs, downhole drilling tool models may also include a shape-based model of the cutting forces on different cutting elements as those cutting elements engage with and remove rock, such as rock chip 708 and the rock in area 712 as illustrated in FIG. 7. Accordingly, the analysis of three dimensional rock chips may be combined with a shape-based analysis of the cutting zones of different cutting elements, as described below with reference to FIGS. 12-16C, in order to analyze and model cutting forces and penetration forces, the amount of rock removed from a borehole as a result of those forces, and the overall efficiency of a drill bit or drill bit design.

Figure 12:
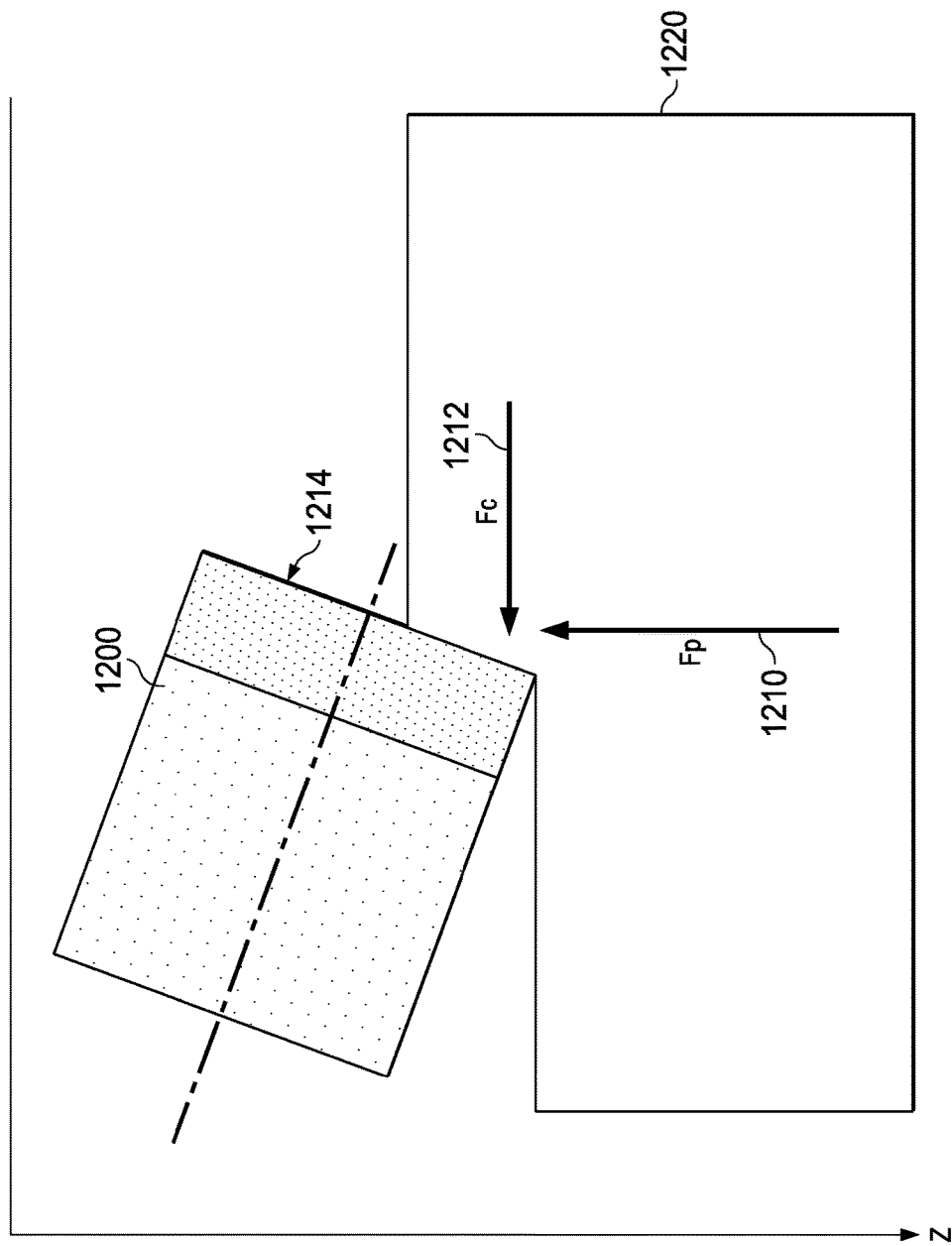
FIG. 12 illustrates a cross sectional view of an exemplary cutting element, including associated drilling forces.

FIG. 12 illustrates a cross sectional view of an exemplary cutting element, including associated drilling forces. As shown in FIG. 12, cutting element 1200 may experience multiple forces as cutting face 1214 of cutting element 1200 engages rock formation 1220 during drilling (e.g., immediately before the cracking of rock and the formation of a rock chip as illustrated in FIG. 7). For example, penetration force 1210 may act in the direction of the bit axis. Further, cutting force 1212 may act perpendicularly to penetration force 1210, in the direction of cutting face 1214. As explained above with reference to FIGS. 6A-B, cutting force 1212 and penetration force 1210 may depend on rock compressive strength ($\sigma$) and the area of a cutting zone on cutting face 1214. As explained in further detail below with reference to FIGS. 13A-B and 14A-B, cutting force 1212 may also depend on the shape of a cutting zone on cutting face 1214.

Figure 13A:
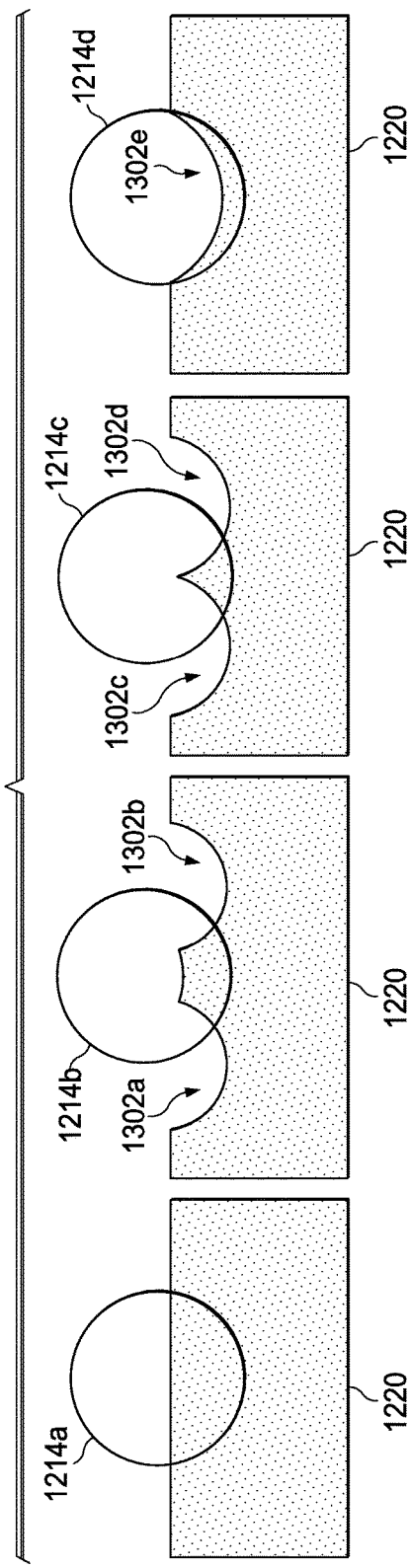
FIG. 13A illustrates profiles of cutting elements, engaged with a geological formation.
Figure 13B:
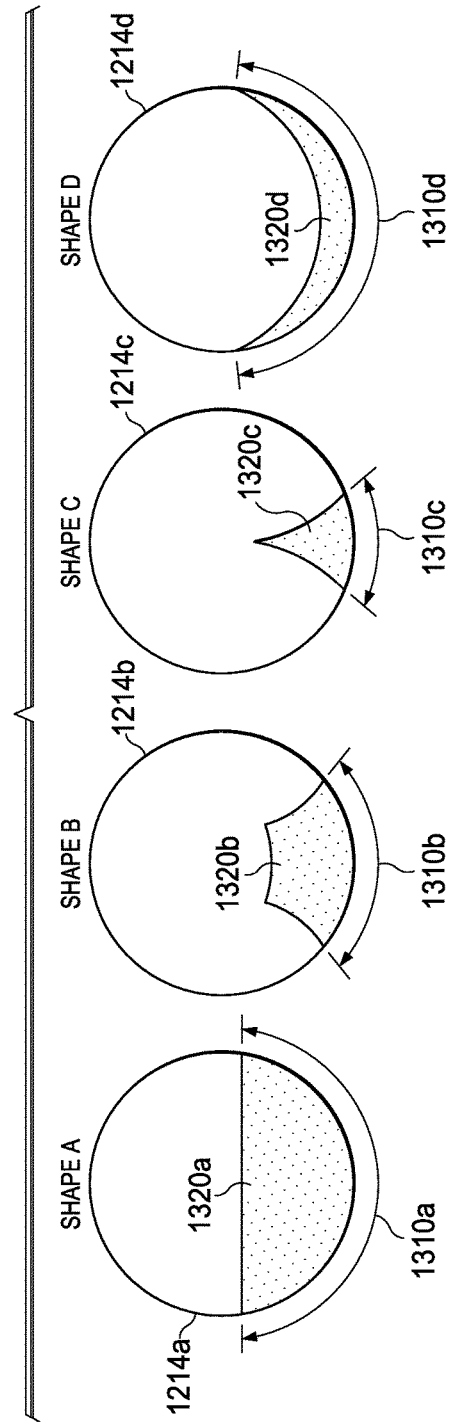
FIG. 13B illustrates cutting zones of cutting elements.

FIG. 13A illustrates profiles of cutting elements, engaged with a rock formation. As shown in FIG. 13A, the shape of the cutting zone on cutting face 1214 of a cutting element may vary depending on the whether the portion of rock formation 1220 engaged by cutting face 1214 has grooves previously cut by other cutting elements. FIG. 13B illustrates the cutting zones of various cutting elements.

For example, cutting face 1214*a* may be the cutting face of a cutting element located on a section of a drill bit with a low cutting-element density (e.g., a section of a drill bit with a relatively low number of cutting elements placed across a given range of radial locations). The engagement of cutting face 1214*a* with rock formation 1220 may not overlap any grooves cut by other cutting elements of the drill bit. Accordingly, the shape of cutting zone 1320*a* (e.g., "shape A") may not be directly affected by any grooves in rock formation 1220 cut by other cutting elements of the drill bit.

As another example, cutting face 1214*b* may be the cutting face of a cutting element located on a section of a drill bit with a high cutting-element density (e.g., a section of a drill bit with a relatively high number of cutting elements placed across a given range of radial locations). The radial location of cutting face 1214*b* may overlap with the respective radial locations of the cutting faces of other cutting elements on a drill bit. Thus, the engagement of cutting face 1214*b* with rock formation 1220 may overlap with grooves 1302*a* and 1302*b*, which have been cut by the cutting elements with overlapping radial locations. Accordingly, as shown in FIGS. 13A-B, the shape of cutting zone 1320*b* (e.g., "shape B") may have a profile affected by grooves 1302*a* and 1302*b*.

As yet another example, cutting face 1214*c* may correspond to a cutting element located on a section of a drill bit with a very high cutting-element density (e.g., a section of a drill bit with a very high number of cutting elements placed across a given range of radial locations). The radial location of cutting face 1214*c* may overlap with the respective radial locations of the cutting faces of other cutting elements on a drill bit. Thus, the engagement of cutting face 1214*c* with rock formation 1220 may overlap with grooves 1302*c* and 1302*d*, which have been cut by the cutting elements with overlapping radial locations. Grooves 1302*c* and 1302*d* may be adjacent to each other or may overlap with each other. Accordingly, as shown in FIGS. 13A-B, the shape of cutting zone 1320*c* (e.g., "shape C") may have a profile affected by grooves 1302*c* and 1302*d*.

As yet another example, cutting face 1214*d* may be the cutting face of a cutting element located on a drill bit with track-set cutting elements. The engagement of cutting face 1214*d* with rock formation 1220 may overlap with groove 1302*e* cut by another cutting element with approximately the same radial position on the drill bit. Accordingly, as shown in FIGS. 13A-B, the shape of cutting zone 1320*d* (e.g., "shape D") may have a profile affected by groove 1302*e*.

Cutting zones 1320*a*, 1320*b*, 1320*c*, 1320*d* are not necessarily drawn to scale in FIG. 13B. For example, cutting zones 1320*a*, 1320*b*, 1320*c*, and 1320*d* of different cutting elements may each include the same cutting area, although the respective shapes of those cutting areas may be different. For a given cutting area, shape B of cutting zone 1320*b* may have a narrower profile that shape A of cutting zone 1320*a*. Likewise, for a given cutting area, shape C of cutting zone 1320*c* may have a narrower profile than both shape A of cutting zone 1320*a* and shape B of cutting zone 1320*b*. Accordingly, arc length 1310*a* of cutting zone 1320*a* may be longer than arc length 1310*b* of cutting zone 1320*b*, which may in turn be longer than arc length 1310*c* of cutting zone 1320*c*. Although FIGS. 13A-B illustrate four distinct cutting-zone shapes, any suitable number of cutting-zone shapes (e.g., two shapes, three shapes, four shapes, etc.) may be identified for the respective cutting zones of a plurality of cutting elements on a drill bit or drill bit design.

As explained above with reference to FIG. 12, cutting force 1212 and penetration force 1210 may depend on rock compressive strength ($\sigma$) and the area of a cutting zones 1320*a*, 1320*b*, 1320*c*, and 1320*d* respectively. Cutting force 1212 and penetration force 1210 may also depend on the respective shapes of cutting zones 1320*a*, 1320*b*, 1320*c*, and 1320*d*. For example, under a given set of drilling parameters (e.g., rock compressive strength, RPM, ROP), and a given cutting-zone area, cutting zones with a narrower profile (e.g., shape B) may experience lower cutting force 1212 and lower penetration force 1210 than cutting zones with a wider profile (e.g., Shape A).

Figure 14A:
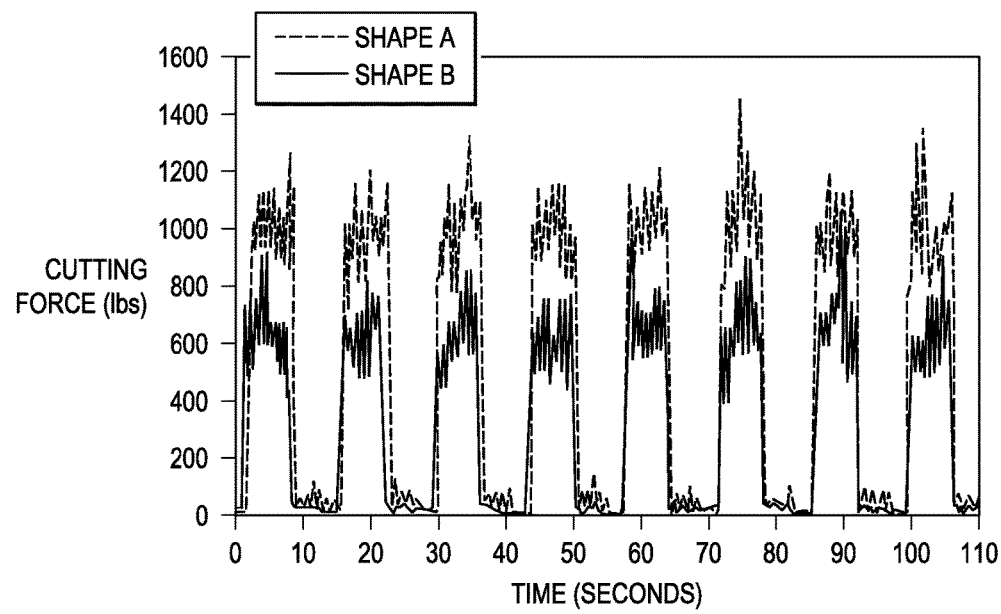
FIGS. 14A-B illustrate exemplary measured drill bit force data.
Figure 14B:
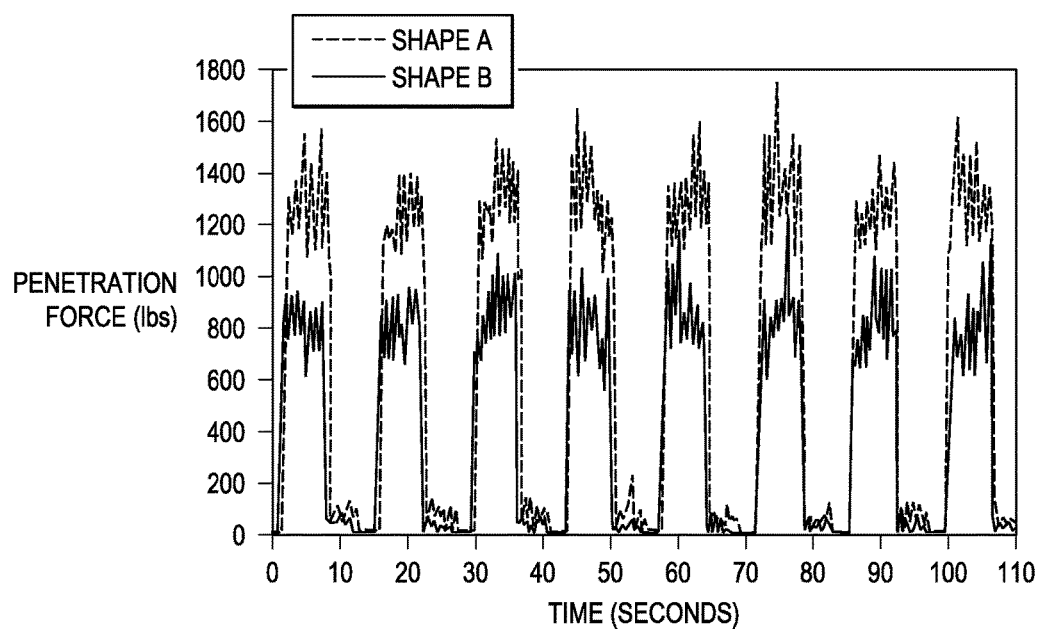

FIGS. 14A-B illustrate exemplary measured drill bit force data. To obtain the data, two cutting elements were configured and tested in a laboratory. A first cutting element and rock formation were configured such that the cutting zone of the cutting element had a depth of cut of 0.050 inches, an arc length of 0.360 inches, an area of 0.0115 square-inches. Further, the first cutting element had a shape consistent with shape A as described above with reference to FIGS. 13A-B. A second cutting element and rock formation were configured such that the cutting zone of the cutting element had a depth of cut of 0.065 inches, an arc length of 0.272 inches, an area of 0.0115 square-inches. Further, the second cutting element had a shape consistent with shape B as described above with reference to FIGS. 13A-B.

Although the cutting areas of the respective cutting zones of the first and second cutting elements were the same (0.0115 square-inches), the measured forces for the first and second cutting elements were different. For example, as shown in FIG. 14A, the cutting force for the cutting element with a shape-A cutting zone was higher than the cutting force for the cutting element with the shape-B cutting zone. Likewise, as shown in FIG. 14B, the penetration force for the cutting element with a shape-A cutting zone was higher than the penetration force for the cutting element with the shape-B cutting zone. Accordingly, the cutting force and penetration force of a cutting element depend on the shape of the cutting zone in addition to the area of the cutting zone of the cutting element.

To account for the shape-based dependency of the cutting and penetration forces, the force equations described above with reference to FIGS. 6A-B may be modified. For example, cutting force may be calculated as expressed by the following shape-based cutting force equation:

$$F_c = \mu * \sigma * \xi * S^\alpha * H^\gamma$$

where $\mu$ is a coefficient related to back rake and side rake angles, $\sigma$ is the rock compressive strength, $\xi$ is a coefficient related to the cutting shape, S is the arc length of the cutting zone, and H is the equivalent cutting height of the cutting zone. Equivalent cutting height, H, may be calculated based on the arc length, S, and the cutting area, A, as follows:

$$H = A/S$$

Further, the penetration force may be calculated and expressed as a function of the cutting force as follows:

$$F_p = \nu * F_c * \tan(\beta + \varphi)$$

where $\beta$ is the back rake angle, $\varphi$ is the rock friction angle, and $\nu$ is a constant coefficient. The shape-based cutting force equation may be applied to any number of different cutting shapes (e.g., shapes A, B, C, and D). The coefficients $\xi$, $\alpha$, and $\gamma$, however, may be vary between different shapes. Moreover, the coefficients may also vary between different types of rock (e.g., granite, sandstone, etc.).

In order to derive one or more of the coefficients for the shape-based cutting force equation, experimental force data for a given cutting shape and type of rock may be analyzed. For example, single-cutter laboratory tests may be conducted such that the cutting area is varied for each cutting shape and given type of rock. Laboratory tests may also be conducted at multiple RPM and ROP settings. The cutting area for each cutting shape and given type of rock may be varied any suitable number of times (e.g., four, eight, or more) to provide a sufficient number of data points from which to derive the various coefficients. Based on the test results, one or more of coefficients $\mu$, $\xi$, $\alpha$, and $\gamma$ may be derived by using mathematical curve fitting techniques to fit the equation with the measured test data for a given cutting shape and type of rock. For example, based on single-cutter laboratory tests in which the cutting area was varied for shape-B cutting zones for sandstone rock, the following single-cutter cutting force equation was derived for shape B cutters interacting with a sandstone formation:

$$F_{c(shape\ B)} = \mu * \sigma * \xi * S^{1.5} * H^{0.5}$$

Although the above derivation of the cutting force equation applies to cutting elements with a shape-B cutting zone interacting with sandstone, cutting force equations for cutting elements with cutting zones having other shapes (e.g., shape A, shape C, shape D, or any other identified shape), and interacting with any type of rock, may be similarly derived based on measured test results for those shapes and types of rock. For example, laboratory tests may be conducted, with sandstone, for multiple cutting elements, each having a shape-A cutting zone, but having different respective cutting-zone areas. From the measured laboratory test results, values for $\alpha$ and $\gamma$ may be derived for cutting elements with a shape-A cutting zone interacting with sandstone, and utilized in the following single-cutter cutting force equation:

$$F_{c(shape\ A, sandstone)} = \mu * \sigma * \xi * S^{\alpha(A, sandstone)} * H^{\gamma(A, sandstone)}$$

Likewise, laboratory tests may be conducted, with sandstone, for multiple cutting elements, each having a shape-C cutting zone, but having different respective cutting-zone areas. From the measured laboratory test results, values for $\alpha$ and $\gamma$ may be derived for cutting elements with a shape-C cutting zone interacting with sandstone, and utilized in the following single-cutter cutting force equation:

$$F_{c(shape\ C, sandstone)} = \mu * \sigma * \xi * S^{\alpha(C, sandstone)} * H^{\gamma(C, sandstone)}$$

Further, laboratory tests may be conducted, with sandstone, for multiple cutting elements, each having a shape-D cutting zone, but having different respective cutting-zone areas. From the measured laboratory test results, values for $\alpha$ and $\gamma$ may be derived for cutting elements with a shape-D cutting zone interacting with sandstone, and utilized in the following single-cutter cutting force equation:

$$F_{c(shape\ D, sandstone)} = \mu * \sigma * \xi * S^{\alpha(D, sandstone)} * H^{\gamma(D, sandstone)}$$

Shape-based cutting force equations derived for a given type of rock and for different cutting shapes, may be used to predict and model drilling efficiencies of various drill bits or drill bit designs. For example, a computer generated three dimensional model of a drill bit design may be utilized to determine the position of each cutting element on the drill bit design. Based on the position of the each cutting element relative to other features on the drill bit design (e.g., other cutting elements, DOCCs, etc.), the cutting area, the arc length (S), and the equivalent cutting height (H), may be determined for the cutting zone of each respective cutting element. Further, the cutting shape for the cutting zone of each respective cutting element may be determined.

The distribution of the actual depth of cut at each cutlet along the cutting edge may be used to determine the category of shapes of a given cutting zone. For example, as illustrated in FIG. 4B, points A, B, C, and D on cutting edge 406a divides the cutting edge into three zones. In zone A to B, the actual depths of cut of cutlets are increasing from A to B (up zone). In zone B to C, the actual depths of cut of all cutlets are equal (flat zone). In zone C to D, the actual depth of cut is decreasing from C to D (down zone). These three zones are characteristics of the exemplary shape-B category of cutting zones, as described above with reference to FIGS. 13A and 13B. Therefore, cutting zone 404a may be categorized as a shape-B cutting zone.

As another example, cutting zone 404e in FIG. 4C may include an up zone from point A to point B, and a down zone from point B to point C. These two zones are characteristics of the exemplary shape-C category of cutting zones, as described above with reference to FIGS. 13A and 13B. Therefore, cutting zone 404e may be categorized as a shape-C cutting zone.

As another example, for the exemplary shape-A category of cutting zones shown in FIGS. 13A and 13B, the distribution of actual depth of cut along cutting edge may be similar to a portion of a circle. Therefore, for the shape-A category of cutting zones, there may be a gradual increase in depth of cut from one edge of the cutting zone to the center of the cutting zone, and a gradual decrease in depth of cut from the center of the cutting zone to another edge of the cutting zone. And as yet another example, for the exemplary shape-D category of cutting zones shown in FIGS. 13A and 13B, almost all cutlets (e.g., more than 90% of cutlets) may have the same depth of cut. Therefore, for the shape-D category of cutting zones, there may be only a flat zone.

The derivative of actual depth of cut to radial distance of each cutlet, d(DOC)/dr, may also be used to determine the category of shapes of a given cutting zone. For example, there may be no singular point of d(DOC)/dr for shape-A cutting zones, two singular points of d(DOC)/dr for shape-B cutting zones, one singular point of d(DOC)/dr for shape-C cutting zones, and a d(DOC)/dr equal to approximately zero for a majority of cutlets (e.g., 90% or more) for shape-D cutting zones.

In some embodiments, the combination of both the distribution of actual depth of cut and the derivative of actual depth of cut to radial distance of each cutlet may be used determine the category of shapes of a given cutting zone. Based on the determined cutting shape, the appropriate shape-based cutting force equation may be applied for each cutting element, and the cutting force may be calculated utilizing the modeled arc length and equivalent cutting height.

A drill bit or drill bit design may include cutting elements having differently shaped cutting zones. For example, a single drill bit or drill bit design may have one or more cutting elements with shape-A cutting zones, one or more cutting elements with shape-B cutting zones, and one or more cutting elements with shape-C cutting zones. Accordingly, different shape-based cutting force equations may be utilized to model the individual cutting forces for different cutting elements. For example, the cutting force for cutting elements with a shape-B cutting zone may be calculated based on the shape-B cutting force equation described above ($F_c=\mu*\sigma*\xi*S^{1.5}*\xi*S^{\alpha}*H^{\gamma}$). Further, the cutting force for cutting elements with cutting zones having other shapes may be calculated based on a shape-based cutting force equation ($F_c=\mu*\sigma*\zeta*S^{\alpha}*H^{\gamma}$) where $\alpha$ and $\gamma$ are determined based on the proper values derived for those other shapes. Thus, a first shape-based cutting force model may be utilized for cutting elements having shape-A cutting zones, a second shape-based cutting force model may be utilized for cutting elements having shape-B cutting zones, and a third shape-based cutting force model may be utilized for cutting elements having shape-C cutting zones.

The separately calculated cutting forces and penetration forces for each individual cutting element of a drill bit design may be combined to determine the total cutting and penetration forces of the drill bit or drill bit design. Vertical components of the forces may be summed to estimate WOB. Further, cutting forces may be multiplied by their respective moment arms to compute TOB.

Further, models of drilling efficiency of a drill bit may be evaluated in terms of mechanical specific energy ($E_s$). Mechanical specific energy may be inversely related to efficiency, and thus a drill bit with a lower mechanical specific energy (e.g., 20 kpsi) may be referred to as more efficient than a drill bit with a higher mechanical specific energy (e.g., 25 kpsi). A drill bit with a lower mechanical specific energy may be referred to as a more efficient drill bit.

FIGS. 15A-C and 16A-C illustrate exemplary measured and modeled drill bit force data. Two drill bits (i.e., drill bit A and drill bit B) with different cutting-element layouts were tested in a laboratory. Drill bit B was configured to have the same number of blades and the same number of cutting elements as drill bit A, but to have cutting elements with different cutting shapes than the corresponding cutting elements of drill bit A by redistributing the cutting elements angularly. Drill bit A and drill bit B had the same total cutting area for a given depth of cut. As described below with reference to FIGS. 15A and 16A, laboratory tests were conducted for drill bit A and drill bit B to determine measured WOB and mechanical specific energy values. And, as described below with reference to FIGS. 15B-C and FIGS. 16B-C, drill bit A and drill bit B were also modeled under the same conditions using (i) an area-based cutting force equation ($F_c=K_c*\sigma*A$) for each cutting element; and (ii) a shape-based cutting force equation ($F_c=\mu*\sigma*\xi*S^{\alpha}*H^{\gamma}$) for each cutting element.

Figure 15A:
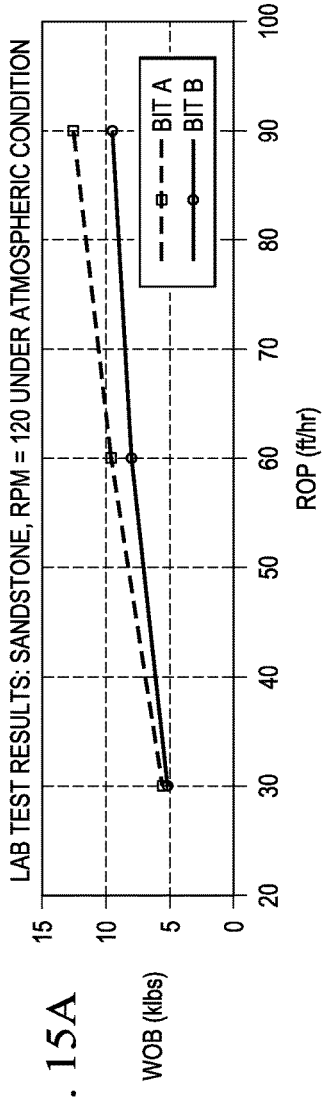
FIGS. 15A-C illustrate exemplary measured and modeled drill bit force data.

FIG. 15A illustrates data for drill bit A and drill bit B as measured in laboratory tests. WOB measurements were recorded for the two drill bits at an RPM of 120 and at ROPs of 30, 60, and 90 ft/hr. As shown in the test results, the measured WOB of drill bit A was greater than the measured WOB of drill bit B, with the difference increasing as ROP increased.

Figure 15B:
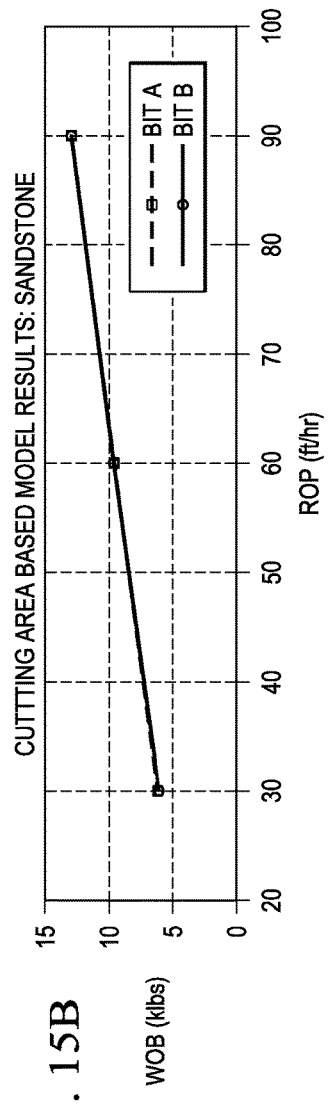

FIG. 15B illustrates data for drill bit A and drill bit B as modeled with an area-based cutting force equation ($F_c=K_c*\sigma*A$) for each cutting element, without three dimensional bit-rock chip interaction. The area-based modeling failed to show a difference between the WOB of drill bit A and the WOB of drill bit B.

Figure 15C:
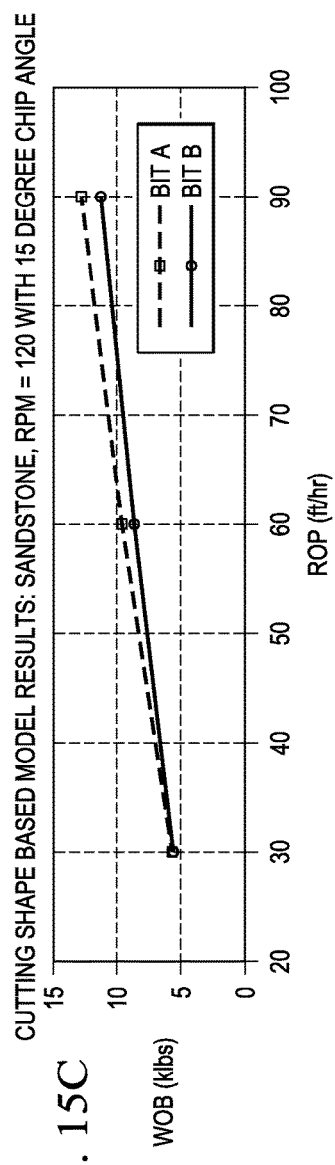

FIG. 15C illustrates data for drill bit A and drill bit B as modeled with shape-based cutting force equations ($F_c=\mu*\sigma*\xi*S^{\alpha}*H^{\gamma}$) for each cutting element, and with three dimensional bit-rock chip interaction. Like the measured laboratory test data shown in FIG. 15A, the shape-based modeling data showed that the WOB of drill bit A was greater than the WOB of drill bit B, and that the difference increased as ROP increased. Accordingly, shape-based modeling of cutting forces along with bit-rock chip interaction modeling, as compared to area-based modeling of cutting forces, may provide a more accurate estimate of the effect on WOB caused by the difference in the layouts of the cutting elements in drill bits or drill bit designs (e.g., the difference in the layouts of the cutting elements in drill bit A and drill bit B).

Figure 16A:
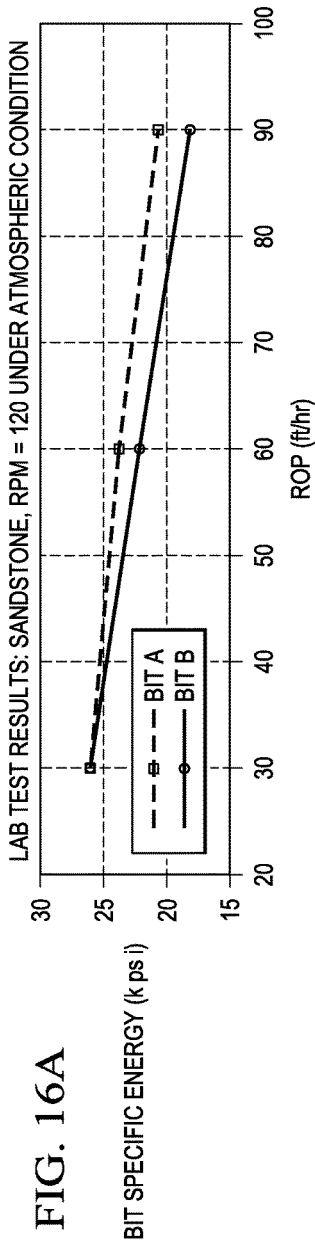
FIGS. 16A-C illustrate exemplary measured and modeled drill bit force data.
Figure 16B:
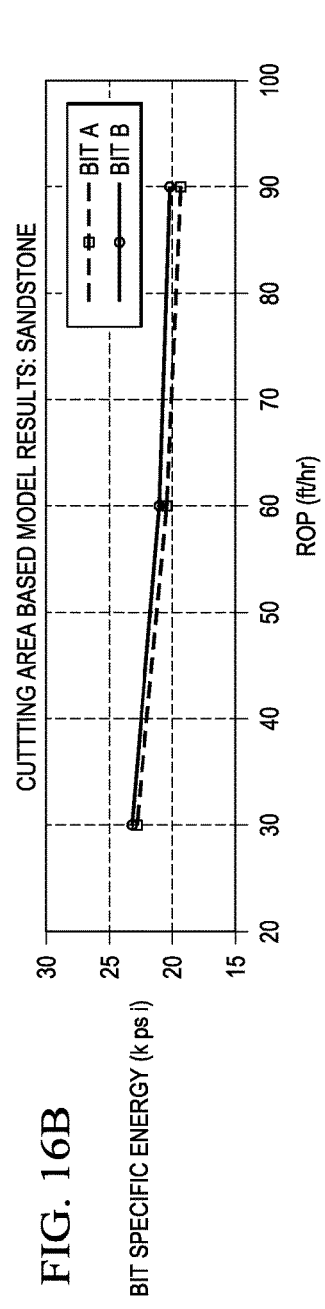
Figure 16C:
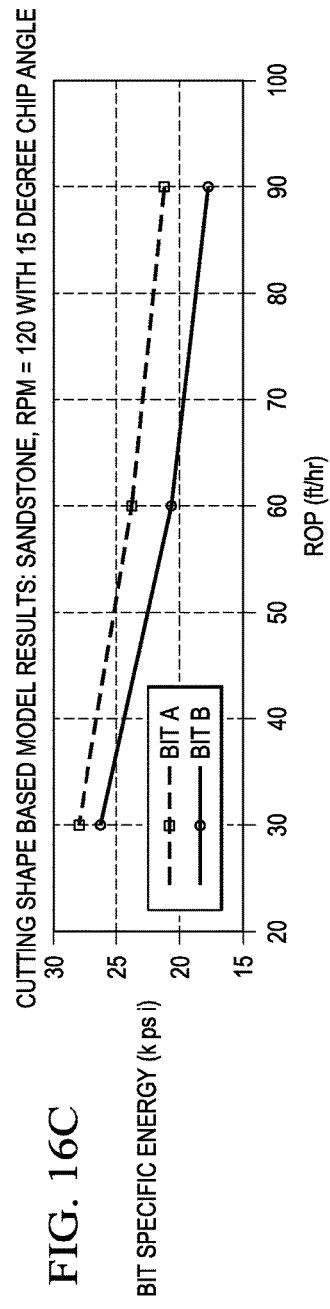

FIGS. 16A-C illustrate mechanical specific energy data corresponding to the WOB data illustrated in FIGS. 15A-C.

As shown in the laboratory test results in FIG. 16A, the measured mechanical specific energy of drill bit A was similar to the measured mechanical specific energy of drill bit B at an ROP of 30. However, at ROPs above 30, the measured mechanical specific energy of drill bit A was larger than the measured mechanical specific energy of drill bit B, with the difference increasing as ROP increased.

FIG. 16B illustrates the mechanical specific energies for drill bit A and drill bit B as modeled with an area-based cutting force equation for each cutting element, without three dimensional bit-rock chip interaction. In contrast with the test results shown in FIG. 16A, the cutting area based modeling predicted that the mechanical specific energy of drill bit A would be lower than the mechanical specific energy of drill bit B, with the difference not changing significantly as ROP increased.

FIG. 16C illustrates the mechanical specific energies for drill bit A and drill bit B as modeled with shape-based cutting force equations for each cutting element, and with three dimensional bit-rock chip interaction. Consistent with the measured test results shown in FIG. 16A, shape-based modeling predicted that the mechanical specific energy of drill bit A would be higher than the mechanical specific energy of drill bit B, with the difference increasing as ROP increased. Accordingly, shape-based modeling of cutting forces along with bit-rock chip interaction modeling, as compared to area-based modeling of cutting forces, may provide a more accurate estimate of the efficiency differences caused by the difference in the layouts of the cutting elements in drill bits or drill bit designs (e.g., the difference in the layouts of the cutting elements in drill bit A and drill bit B).

Figure 17:
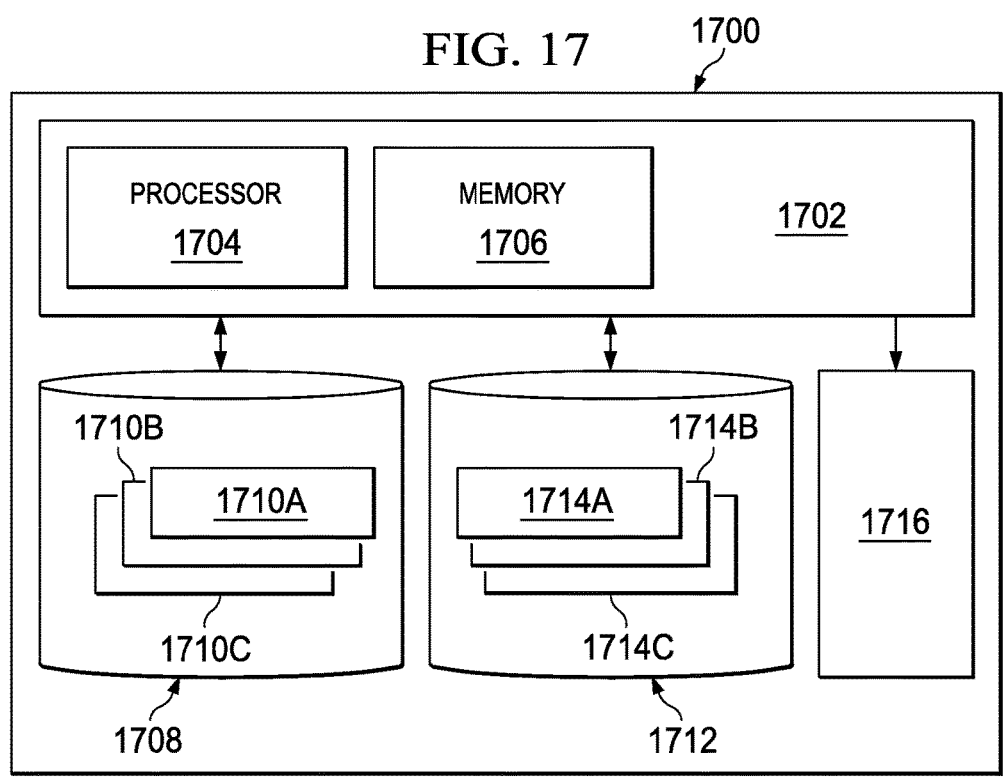
FIG. 17 illustrates a block diagram of an exemplary downhole drilling tool modeling system.

FIG. 17 illustrates a block diagram of an exemplary downhole drilling tool modeling system 1700.

Downhole drilling tool modeling system 1700 may be configured to perform three dimensional modeling of interactions between drill bits and rock chips. Downhole drilling tool modeling system 1700 may also be configured to perform shape-based modeling of the interaction between the cutting zones of cutting elements of a drill bit design and such rock chips.

Downhole drilling tool modeling system 1700 may include modeling module 1702. Modeling module 1702 may include any suitable components. For example, modeling module 1702 may include processor 1704. Processor 1704 may include, for example a microprocessor, microcontroller, digital signal processor (DSP), application specific integrated circuit (ASIC), or any other digital or analog circuitry configured to interpret and/or execute program instructions and/or process data. Processor 1704 may be communicatively coupled to memory 1706. Processor 1704 may be configured to interpret and/or execute program instructions and/or data stored in memory 1706. Program instructions or data may constitute portions of software for carrying out shape-based modeling of the interaction between the cutting zones of cutting elements of a drill bit design and rock formation, as described herein. Program instructions or data may also constitute portions of software for carrying out three dimensional modeling of interactions between drill bits and rock chips, as described herein. Memory 1706 may include any system, device, or apparatus configured to hold and/or house one or more memory modules. For example, memory 1706 may include read-only memory, random access memory, solid state memory, or disk-based memory. Each memory module may include any system, device or apparatus configured to retain program instructions and/or data for a period of time (e.g., computer-readable non-transitory media).

Downhole drilling tool modeling system 1700 may further include bit design database 1708. Bit design database 1708 may be communicatively coupled to modeling module 1702 and may provide drill bit designs 1710a-1710c in response to a query or call by modeling module 1702. Drill bit designs 1710a-1710c may be implemented in any suitable manner, such as by parameters, functions, definitions, instructions, logic, or code, and may be stored in, for example, a database, file, application programming interface, library, shared library, record, data structure, service, software-as-service, or any other suitable mechanism. Drill bit designs 1710a-1710c may specify any suitable configuration of components of a drill bit, such as, for example, components of drill bit 101, discussed above with reference to FIG. 1, 2, or 3A. Although bit design database 1708 is illustrated as including three drill bit designs, bit design database 1708 may contain any suitable number of drill bit designs.

Downhole drilling tool modeling system 1700 may further include rock property database 1712. Rock property database 1712 may be communicatively coupled to modeling module 1702 and may provide rock property parameters 1714a-1714c in response to a query or call by modeling module 1702. Rock property parameters 1714a-1714c may be implemented in any suitable manner, such as by parameters, functions, definitions, instructions, logic, or code, and may be stored in, for example, a database, file, application programming interface, library, shared library, record, data structure, service, software-as-service, or any other suitable mechanism. Rock property parameters 1714a-1714c may specify any suitable properties or parameters of geological formations, such as rock compressive strength, rock shear strength, rock failure mode, porosity, rock strength, or density. Rock property parameters 1714a-1714c may further include parameters specifying rock chip angles, such as rock chip angle 820 (discussed above with reference to FIG. 8) associated with any suitable combinations of drilling parameters or formation properties. Although rock property database 1712 is illustrated as including three instances of rock property parameters, rock property database 1712 may contain any suitable number of instances of rock property parameters.

Modeling module 1702 may be configured to cause processor 1706 to determine a position of one or more cutting elements on one or more blades of a drill bit, such as cutting elements 128 of FIG. 1. Modeling module 1702 may also be configured to determine the shape of the cutting zones of one or more cutting elements. For example, modeling module 1702 may be configured to determine the shape of the respective on or more cutting zones of one or more cutting elements based on calculated depths of cuts for various cutlets within each cutting zone, as described above with reference to FIGS. 4B and 4C. Further, modeling module 1702 may be configured to determine the area of the cutting zone of each cutting element, as well as the arc length and the equivalent cutting height of the cutting zone of each cutting element, based on the position of the cutting element on the drill bit design and/or the position of the cutting element relative to the position of other cutting elements on the drill bit design. Additionally, modeling module 1702 may be configured to model the cutting and penetration forces occurring during interaction between the cutting elements of a drill bit design and a rock formation, based on the determined shape and area of the cutting zones of each cutting element.

Modeling module 1702 may be further configured to perform three dimensional modeling of interactions between drill bits and rock chips. For example, modeling module 1702 may be configured to import one or more instances of drill bit designs 1710a-1710c, and/or one or more instances of rock property parameters 1714a-1714c. Drill bit designs

1710*a*-1710*c*, and/or rock property parameters 1714*a*-1714*c* may be stored in memory 1706.

Modeling module 1702 may also be configured to cause processor 1704 to execute program instructions operable to perform three dimensional modeling of interactions between drill bits and rock chips. When modeling the interaction of a cutting element and a rock chip, modeling module 1702 may also cause processor 1704 to execute program instructions operable to perform shape-based modeling of the forces occurring due to the interaction between the cutting zones of cutting elements of a drill bit design and the rock chip. Processor 1704 may also, based on drill bit designs 1710*a*-1710*c*, generate a model of an initial borehole bottom by modeling a full revolution of a drill bit represented in drill bit designs 1710*a*-1710*c* without axial penetration.

Modeling module 1702 may also be configured to identify locations for one or more cutlets associated with the cutting elements. For example, modeling module 1702 may identify a location of a cutting element in polar coordinates by identifying a radial coordinate and an angular coordinate, such as radial coordinate $R_{504}$ or angular coordinate $\theta_{504}$ of FIG. 5. Modeling module 1702 may be further configured to calculate a depth of cut for each cutlet based on the location of the cutlet and a three dimensional model of a borehole bottom, such as depth of cut 814 of FIG. 8. Additionally, modeling module 1702 may be configured to model three dimensional rock chips for each cutting element, if a depth of cut of at least one cutlet associated with the cutting element is greater than a critical depth of cut, such as critical depth of cut 910 of FIG. 9. For example, a two dimensional model of a rock chip associated with each cutlet may be calculated, such as modeled rock chip 808. Each two dimensional rock chip may include a rock chip angle (such as rock chip angle 820 of FIG. 8) and a rock chip length (such as rock chip lengths 906*a*-906*k* of FIG. 9). A single rock chip angle may be determined based on rock shear strength, drilling pressure, rock failure mode, porosity, rock strength, density, or any other suitable drilling parameters, or formation property.

Modeling module 1702 may be further configured to cause processor to update a three dimensional model of the borehole bottom by removing each of the three dimensional rock chip models. For example, modeling module 1702 may be configured to determine a rock chip boundary for each of the three dimensional rock chip models, such as rock chip boundary 1018 of FIG. 10. A rock chip boundary may include an area bounded by a cutting face of a cutting element and a rock chip length associated with two dimensional models of rock chips associated with cutlets of a cutting element, such as area 1020 of FIG. 10. Further, modeling module 1702 may be configured to assign updated depths to a modeled borehole bottom for each coordinate grid point within each rock chip boundary, as previously discussed with reference to FIG. 10.

Modeling module 1702 may be configured to calculate forces acting on cutting elements, based on shape-dependent modeling of the interaction between the cutting zones of cutting elements and the updated three dimensional model of a borehole bottom, excluding the previously removed rock chips. Additionally, modeling module 1702 may be configured to estimate a drilling efficiency of the drill bit based on the modeled forces occurring during the interaction between the cutting zones of the cutting elements and the borehole bottom. Further, modeling module 1702 may be configured to calculate a mechanical specific energy of a drill bit or drill bit design.

Modeling module 1702 may also be configured to modify a design parameter of a drill bit design based on the modeled efficiency of the drill bit design. For example, modeling module 1702 may be configured to modify the number of cutting elements, the location of cutting elements, and/or the orientation (e.g., the back rake angle, side rake angle, and/or profile angle) of cutting elements, located on one or more blades of a drill bit design, in order to optimize efficiency.

Further, modeling module 1702 may be configured to calculate drilling efficiencies for multiple instances of drill bit designs 1710*a*-1710*c*, where each instance of drill bit design 1710*a*-1710*c* is modeled based on a particular set of rock property parameters 1714*a*-1714*c*. Modeling module 1702 may be configured to calculate drilling efficiencies for a particular instance of drill bit design 1710*a*-1710*c*, based on a various different instances of rock property parameters 1714*a*-1714*c*. In embodiments where modeling module 1702 is configured to model more than one drill bit design-rock property combination, modeling module 1702 may be further configured to indicate or select a drill bit design with the highest efficiency. Modeling module 1702 may be configured to rank or order drill bit designs by modeled drilling efficiency. Modeling module 1702 may be communicatively coupled to various displays 1716 such that information processed by modeling module 1702 (e.g., drill bit efficiency) may be conveyed to operators of drilling equipment.

Modifications, additions, or omissions may be made to FIG. 17 without departing from the scope of the present disclosure. For example, FIG. 17 shows a particular configuration of components of downhole drilling tool modeling system 1700. However, any suitable configurations of components may be used. For example, components of downhole drilling tool modeling system 1700 may be implemented either as physical or logical components. Furthermore, functionality associated with components of downhole drilling tool modeling system 1700 may be implemented in special purpose circuits or components. Functionality associated with components of downhole drilling tool modeling system 1700 may also be implemented in configurable general purpose circuit or components. For example, components of downhole drilling tool modeling system 1700 may be implemented by configure computer program instructions.

Figure 18:
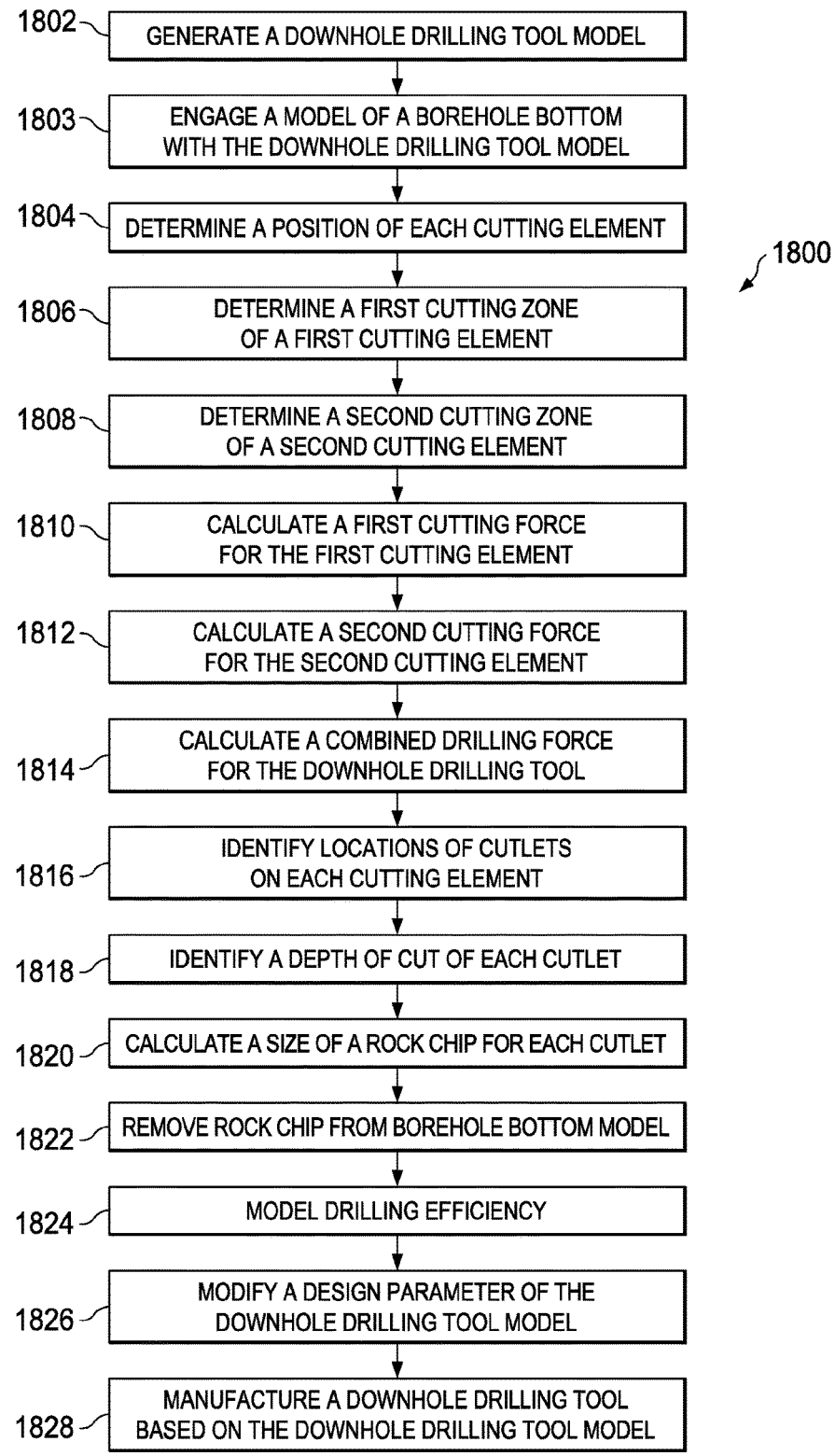
FIG. 18 illustrates a flow chart of an exemplary method for modeling interactions between cutting elements of a drill bit and a geological formation and manufacturing a downhole drilling tool based on the interactions.

FIG. 18 illustrates a flow chart of an exemplary method 1800 for modeling interactions between cutting elements of a drill bit and a geological formation and manufacturing a downhole drilling tool based on the interactions. In the illustrated embodiment the cutting structures of the bit including at least the locations and orientations of all cutting elements may have been previously designed. However, method 1800 may include steps for modifying the design of the drill bit, including for example, modifying the number and/or placement of cutting elements on the drill bit.

The steps of method 1800 may be performed to simulate, design, and manufacture downhole drilling tools. For example, some steps of method 1800 may be performed by downhole drilling tool modeling system 1700, discussed above with reference to FIG. 17. The programs and models may include instructions stored on a computer readable medium and operable to perform, when executed, one or more of the steps described below. The computer readable media may include any system, apparatus or device configured to store and retrieve programs or instructions such as a hard disk drive, a compact disc, flash memory or any other suitable device. The programs and models may be configured to direct a processor or other suitable unit to retrieve and execute the instructions from the computer readable media.

At step 1802, a three dimensional downhole drilling tool model may be generated. For example, downhole drilling tool model may include a drill bit design, such as one of drill bit designs 1210a-1210c of FIG. 12. A design of a drill bit may include a representation of a configuration of blades and cutting elements, such as those shown in FIGS. 1, 2, and 3A. Further, a design of a drill bit may include coordinate locations of cutting elements with reference to a bit rotational axis. Coordinate locations may be implemented in polar, Cartesian, or spherical coordinate systems.

At step 1803, a model of a borehole bottom may be engaged with the downhole drilling tool model. For example, the downhole drilling tool model may engage the model of the borehole bottom model in a simulation of a full revolution of the drill bit design with ROP equal to zero. Subsequently, downhole drilling tool model may engage the model of the borehole bottom model in a simulation of one ore more revolutions of the drill bit design with non-zero ROP.

At step 1804, a position for each of a plurality of cutting elements on a plurality of blades of the downhole drilling tool model may be determined. For example, the downhole drilling tool model may identify coordinate locations of cutting elements such as cutting elements 128 of FIG. 2. Each such location may include a radial distance from a rotational axis, such as radial coordinate $R_{504}$ of FIG. 5. Each such location may further include an angular coordinate, such as angular coordinate $\theta_{504}$ of FIG. 5.

At step 1806, a first cutting zone of a first cutting element may be determined based on an area of the first cutting element that engages the model of the borehole bottom. And at step 1808, a second cutting zone of a second cutting element may be determined based on an area of the second cutting element that engages the model of the borehole bottom. As described above with reference to FIGS. 13A-B, the cutting zones of different cutting elements may have different respective shapes. For example, the first cutting zone may have first cutting zone shape (e.g., Shape B), and the second cutting zone may have a second cutting zone shape (e.g., Shape C). The respective shapes may be determined, as described above with reference to FIGS. 4B and 4C, based on, for example, calculated depths of cuts for various cutlets within each of the respective cutting zones of the first cutting element and the second cutting element.

At step 1810, a first cutting force for the first cutting element may be calculated based on dimensions of the first cutting zone and a first equation corresponding to the first cutting zone shape. And at step 1812, a second cutting force for the second cutting element may be calculated based on dimensions of the second cutting zone and a second equation corresponding to the second cutting zone shape. The first cutting force and the second cutting force may represent cutting forces occurring as the first cutting element and the second cutting element engage with rock at the borehole bottom immediately before the cracking of rock and the formation of a rock chip as illustrated in FIG. 7.

The arc length (S) and the equivalent cutting height (H) may be determined for the respective cutting zones of the first cutting element and the second element. The first cutting force may then be determined based on the shape-based cutting force equation ($F_c = \mu * \sigma * \xi * S^\alpha * H^\gamma$). As described above with reference to FIGS. 14A-B, $\alpha$ and $\gamma$ may have been derived based on laboratory test results to equal 1.5 and 0.5 respectively, for shape-B cutting zones. Accordingly, for embodiments in which the first cutting element has been determined to have a shape-B cutting zone, $\alpha$ may set to a value of 1.5, $\gamma$ may be set to a value of 0.5, and the first cutting force may be calculated according to the following equation shape-B cutting force equation:

$$F_{c(shape\ B)} = \mu * \sigma * \xi * S^{1.5} * H^{0.5}$$

The second cutting force may also be determined based on the shape-based cutting force equation ($F_c = \mu * \sigma * \xi * S^\alpha * H^\gamma$). For example, as described above with reference to FIGS. 14A-B, values for $\alpha$ and $\gamma$ may be derived for cutting elements with a shape-C cutting zone in a similar manner as derived for cutting elements with shape-B cutting zones. Accordingly, for embodiments in which the second cutting element has been determined to have a shape-C cutting zone, $\alpha$ and $\gamma$ may be set to values that were derived for cutting elements with a shape-C cutting zone, and utilized in the following shape-C cutting force equation:

$$F_{c(shape\ C)} = \mu * \sigma * \xi * S^{\alpha(C)} * H^{\gamma(C)}$$

At step 1814, a combined drilling force for the downhole drilling tool may be calculated. For example, a combined cutting force of the drill bit or drill bit design may be determined based, at least in part, on the first and second cutting forces. For example, each of the individual cutting forces may be multiplied by their respective moment arms to compute TOB. Further, vertical components of the individual cutting forces may be summed with vertical components of penetration forces to estimate WOB.

At step 1816, a location of a cutlet may be identified. For example, cutlets may be associated with discrete points along a cutting edge of a cutting element, such as cutlets 606a-606c of FIG. 6. Further, the downhole drilling tool model may identify a coordinate location of a cutlet, including a radial distance from a rotational axis, such as radial coordinate $R_{504}$ of FIG. 5, and an angular coordinate, such as angular coordinate $\theta_{504}$ of FIG. 5.

At step 1818, a depth of cut for a cutlet may be identified. A depth of cut may include a distance between a surface of a formation and a cutting edge of a cutting element, such as modeled depth of cut 814 of FIG. 8. Depth of cut may depend on drilling parameters such as RPM and ROP.

At step 1820, a size of a two dimensional rock chip for the cutlet may be calculated. If the depth of cut is less than a critical depth of cut, such as depth of cut associated with cutlet 904a of FIG. 9, no rock chip will be generated. If the depth of cut is greater than a critical depth of cut, such as depth of cut associated with cutlet 904e of FIG. 9, a rock chip will be generated. A size of a rock chip may be determined according to a depth of cut and a chip angle, for example rock chip angle 820 of FIG. 8. A two dimensional rock chip may be modeled as having a straight crack trajectory, such as crack trajectory 818 to simplify modeling computations.

At step 1822, a three dimensional rock chip may be removed from the model of the borehole bottom. Cutting elements may have an associated cutting direction, such as cutting direction 1016 of FIG. 10. A downhole drilling model may model rock chips associated with cutlets as parallel to the cutting direction, such as rock chip lengths 1008a-1008d of FIG. 10. The downhole drilling model may further identify a rock chip boundary that encompasses the cutting element cutting face and the lengths of the rock chips. Further, the downhole drilling model may update a borehole bottom depth for a set of points within the rock chip boundary.

At step 1824, the drilling efficiency of the downhole drilling tool model may be modeled based at least on the first cutting force and the second cutting force. The drilling efficiency of the downhole drilling tool model may depend, at least in part, on the amount of rock removed from the model of the borehole bottom (e.g., the rock removed in step 1822), and the drilling forces required to remove that rock (e.g., the combined cutting force modeled in step 1814). Drilling efficiency may be evaluated in terms of mechanical specific energy ($E_s$). A downhole drilling tool with a lower mechanical specific energy may be referred to as a more efficient downhole drilling tool. As described above with reference to FIGS. 6A-B and FIGS. 14A-B mechanical specific energy of a downhole drilling tool or downhole drilling tool model may be expressed as a function of borehole cross-sectional area ($A_{bh}$), WOB, and TOB, among other parameters.

At step 1826, a design parameter of the downhole drilling tool model may be modified based on the drilling efficiency of the downhole drilling tool model. For example, the number of cutting elements, the location of cutting elements, and/or the orientation (e.g., the back rake angle, side rake angle, and/or profile angle) of cutting elements, located on one or more blades of the downhole drilling tool model, may be modified in order to optimize efficiency. As described above with reference to FIGS. 13A-B, the shape of the cutting zone of a cutting element may depend on whether the radial location of the cutting element overlaps with the radial location of other cutting elements. In turn, the extent to which the radial locations of different cutting elements overlap may depend in part on the number of cutting elements placed on different sections of a drill bit design. Thus, modifying the number of cutting elements and/or redistributing the cutting elements located on the blades of a downhole drilling tool model may alter the shape of the cutting zones of one or more cutting elements, which in turn may alter the shape-based modeling of the cutting forces of those cutting elements and the drilling efficiency of the downhole drilling tool model as a whole.

At step 1828, a downhole drilling tool may be manufactured based on the downhole drilling tool model. The downhole drilling tool may implement design parameters modified, for example, during step 1826.

Steps of method 1800 may be repeated for modeling efficiency of one or more drill bits or drill bit designs. Accordingly, drilling efficiencies of multiple drill bits or drill bit designs may be evaluated and compared. Further, steps of method 1800 may be repeated for a single design which is iteratively altered in order to maximize drilling efficiency. Alternatively, steps of method 1800 may be used to select among existing drill bit designs or drill bits to select a more efficient bit for a particular set of drilling parameters. Once one or more drill bit efficiencies are modeled using certain steps of method 1800, a drill bit may be manufactured according to the calculated design constraints to provide a more efficient drill bit. Modifications, additions or omissions may be made to method 1800 without departing from the scope of the disclosure.

In a specific embodiment, elements of which may be used in combination with other embodiments, the disclosure relates to a method of designing a downhole drilling tool, including generating a three dimensional (3D) downhole drilling tool model including a plurality of cutting elements on a plurality of blades, simulating engagement of the 3D downhole drilling tool model with a three dimensional model of a borehole bottom, determining a first cutting zone of a first cutting element based on an area of the first cutting element that engages the borehole bottom, the first cutting zone having a first cutting zone shape, determining a second cutting zone of a second cutting element based on an area of the second cutting element that engages the borehole bottom, the second cutting zone having a second cutting zone shape, calculating a first cutting force for the first cutting element based on the first cutting zone shape, calculating a second cutting force for the second cutting element based on the second cutting zone shape, modeling a drilling efficiency of the 3D downhole drilling tool model based at least on the first cutting force and the second cutting force, and modifying a design parameter of the 3D downhole drilling tool model based on the drilling efficiency of the 3D downhole drilling tool model. Modifying the design parameter of the 3D downhole drilling tool model may comprise modifying the first cutting zone shape of the first cutting element. Further, the method may include determining a third cutting zone of a third cutting element based on an area of the third cutting element that engages the borehole bottom, the third cutting zone having a third cutting zone shape, and calculating a third cutting force for the third cutting element based on the third cutting zone shape. The method may also include determining an arc length of a first cutting zone associated with the first cutting element, determining an arc length of a second cutting zone associated with the second cutting element, calculating an equivalent cutting height of the first cutting zone based on the arc length of the first cutting zone and an area of the first cutting zone, and calculating an equivalent cutting height of the second cutting zone based on the arc length of the second cutting zone and an area of the second cutting zone. The method may also include calculating a combined drilling force for the 3D downhole drilling tool model based on the calculation of the first cutting force and the calculation of the second cutting force. In addition, the method may include identifying a location for each of a plurality of cutlets associated with each cutting element, calculating a depth of cut for each cutlet based on the location of the cutlet and the 3D model of the borehole bottom, generating a 3D rock chip model for each cutting element, in response to the depth of cut of at least one of the plurality of cutlets associated with the cutting element being greater than a critical depth of cut, each 3D rock chip model including a two dimensional (2D) model of a rock chip associated with each cutlet, and updating the 3D model of the borehole bottom by removing each of the 3D rock chip models, wherein the modeling of the drilling efficiency of the 3D downhole drilling tool model is based further on the updated 3D model of the borehole bottom with each of the 3D rock chip models removed. Modelling the drilling efficiency of the 3D downhole drilling tool model may include calculating a mechanical specific energy of the 3D downhole drilling tool model.

In another specific embodiment, elements of which may be used in combination with other embodiments, the disclosure relates to a non-transitory machine-readable medium comprising instructions stored therein, the instructions executable by one or more processors to facilitate performing a method for designing a downhole drilling tool. The method for designing a downhole drilling tool may include generating a three dimensional (3D) downhole drilling tool model, simulating engagement of the 3D downhole drilling tool model with a 3D model of a borehole bottom, determining a first cutting zone of a first cutting element based on an area of the first cutting element that engages the borehole bottom, the first cutting zone having a first cutting zone shape, determining a second cutting zone of a second cutting element based on an area of the second cutting element that engages the borehole bottom, the second cutting zone having a second cutting zone shape, calculating a first cutting force for the first cutting element based on the first cutting zone shape, calculating a second cutting force for the second cutting element based on the second cutting zone shape, modeling a drilling efficiency of the 3D downhole drilling tool model based at least on the first cutting force and the second cutting force, and modifying a design parameter of the 3D downhole drilling tool model based on the drilling efficiency of the 3D downhole drilling tool model. Modifying the design parameter of the 3D downhole drilling tool model may comprise modifying the first cutting zone shape of the first cutting element. Further, the method may include determining a third cutting zone of a third cutting element based on an area of the third cutting element that engages the borehole bottom, the third cutting zone having a third cutting zone shape, and calculating a third cutting force for the third cutting element based on the third cutting zone shape. The method may also include determining an arc length of a first cutting zone associated with the first cutting element, determining an arc length of a second cutting zone associated with the second cutting element, calculating an equivalent cutting height of the first cutting zone based on the arc length of the first cutting zone and an area of the first cutting zone, and calculating an equivalent cutting height of the second cutting zone based on the arc length of the second cutting zone and an area of the second cutting zone. The method may also include calculating a combined drilling force for the 3D downhole drilling tool model based on the calculation of the first cutting force and the calculation of the second cutting force. In addition, the method may include identifying a location for each of a plurality of cutlets associated with each cutting element, calculating a depth of cut for each cutlet based on the location of the cutlet and the 3D model of the borehole bottom, generating a 3D rock chip model for each cutting element, in response to the depth of cut of at least one of the plurality of cutlets associated with the cutting element being greater than a critical depth of cut, each 3D rock chip model including a two dimensional (2D) model of a rock chip associated with each cutlet, and updating the 3D model of the borehole bottom by removing each of the 3D rock chip models, wherein the modeling of the drilling efficiency of the 3D downhole drilling tool model is based further on the updated 3D model of the borehole bottom with each of the 3D rock chip models removed. Modelling the drilling efficiency of the 3D downhole drilling tool model may include calculating a mechanical specific energy of the 3D downhole drilling tool model.

In yet another specific embodiment, elements of which may be used in combination with other embodiments, the disclosure relates to a downhole drilling tool modeling system, including a processor and a memory communicatively coupled to the processor with computer program instructions stored therein. The instructions may be configured to, when executed by the processor, cause the processor to generate a three dimensional (3D) downhole drilling tool model, simulate engagement of the 3D downhole drilling tool model with a 3D model of a borehole bottom, determine a first cutting zone of a first cutting element based on an area of the first cutting element that engages the borehole bottom, the first cutting zone having a first cutting zone shape, determine a second cutting zone of a second cutting element based on an area of the second cutting element that engages the borehole bottom, the second cutting zone having a second cutting zone shape, calculate a first cutting force for the first cutting element based on the first cutting zone shape, calculate a second cutting force for the second cutting element based on the second cutting zone shape, model a drilling efficiency of the 3D downhole drilling tool model based at least on the first cutting force and the second cutting force, and modify a design parameter of the 3D downhole drilling tool model based on the drilling efficiency of the 3D downhole drilling tool model. Modifying the design parameter of the 3D downhole drilling tool model may comprise modifying the first cutting zone shape of the first cutting element. The instructions may be further configured to cause the processor to determine a third cutting zone of a third cutting element based on an area of the third cutting element that engages the borehole bottom, the third cutting zone having a third cutting zone shape, and calculate a third cutting force for the third cutting element based on the third cutting zone shape. The instructions may also be further configured to cause the processor to determine an arc length of a first cutting zone associated with the first cutting element, determine an arc length of a second cutting zone associated with the second cutting element, calculate an equivalent cutting height of the first cutting zone based on the arc length of the first cutting zone and an area of the first cutting zone, and calculate an equivalent cutting height of the second cutting zone based on the arc length of the second cutting zone and an area of the second cutting zone. Further, the instructions may be configured to cause the processor to calculate a combined drilling force for the 3D downhole drilling tool model based on the calculation of the first cutting force and the calculation of the second cutting force. In addition, the instructions may be configured to cause the processor to identify a location for each of a plurality of cutlets associated with each cutting element, calculate a depth of cut for each cutlet based on the location of the cutlet and the 3D model of the borehole bottom, generate a 3D rock chip model for each cutting element, in response to the depth of cut of at least one of the plurality of cutlets associated with the cutting element being greater than a critical depth of cut, each 3D rock chip model including a two dimensional (2D) model of a rock chip associated with each cutlet, and update the 3D model of the borehole bottom by removing each of the 3D rock chip models, wherein the modelling of the drilling efficiency of the 3D downhole drilling tool model is based further on the updated 3D model of the borehole bottom with each of 3D dimensional rock chip models removed. Modelling the drilling efficiency of the 3D downhole drilling tool model may include calculating a mechanical specific energy of the 3D downhole drilling tool model.

Although the present disclosure has been described with several embodiments, various changes and modifications may be suggested to one skilled in the art. For example, although the present disclosure describes the configurations of cutting elements with respect to drill bits, the same principles may be used to model the efficiency of any suitable drilling tool according to the present disclosure. It is intended that the present disclosure encompasses such changes and modifications as fall within the scope of the appended claims.

What is claimed is:

1. A method of designing a downhole drilling tool, the method comprising:
   generating a three dimensional (3D) downhole drilling tool model including a plurality of cutting elements on a plurality of blades;
   simulating engagement of the 3D downhole drilling tool model with a 3D model of a borehole bottom;
   determining a first cutting zone of a first cutting element based on an area of the first cutting element that engages the borehole bottom, the first cutting zone having a first cutting zone shape;

determining a second cutting zone of a second cutting element based on an area of the second cutting element that engages the borehole bottom, the second cutting zone having a second cutting zone shape;

determining an arc length of the first cutting zone associated with the first cutting element;

determining an arc length of the second cutting zone associated with the second cutting element;

calculating an equivalent cutting height of the first cutting zone based on an area of the first cutting zone divided by the arc length of the first cutting zone;

calculating an equivalent cutting height of the second cutting zone based on an area of the second cutting zone divided by the arc length of the second cutting zone;

calculating a first cutting force for the first cutting element based on the first cutting zone shape, arc length of the first cutting zone, and an equivalent cutting height of the first cutting zone calculating a second cutting force for the second cutting element based on the second cutting zone shape, arc length of the second cutting zone, and an equivalent height of the second cutting zone modeling a drilling efficiency of the 3D downhole drilling tool model based at least on the first cutting force and the second cutting force; and modifying a design parameter of the 3D downhole drilling tool model based on the drilling efficiency of the 3D downhole drilling tool model.

2. The method of claim 1, wherein modifying the design parameter of the 3D downhole drilling tool model comprises modifying the first cutting zone shape of the first cutting element.

3. The method of claim 1, further comprising:

determining a third cutting zone of a third cutting element based on an area of the third cutting element that engages the borehole bottom, the third cutting zone having a third cutting zone shape; and calculating a third cutting force for the third cutting element based on the third cutting zone shape.

4. The method of claim 1, further comprising calculating a combined drilling force for the 3D downhole drilling tool model based on the calculation of the first cutting force and the calculation of the second cutting force.

5. The method of claim 1, further comprising:

identifying a location for each of a plurality of cutlets associated with each cutting element;

calculating a depth of cut for each cutlet based on the location of the cutlet and the 3D model of the borehole bottom;

generating a 3D rock chip model for each cutting element, in response to the depth of cut of at least one of the plurality of cutlets associated with the cutting element being greater than a critical depth of cut, each 3D rock chip model including a two dimensional (2D) model of a rock chip associated with each cutlet; and updating the 3D model of the borehole bottom by removing each of the 3D rock chip models;

wherein the modeling of the drilling efficiency of the 3D downhole drilling tool model is based further on the updated 3D model of the borehole bottom with each of the 3D rock chip models removed.

6. The method of claim 5, wherein modeling the drilling efficiency of the 3D downhole drilling tool model comprises calculating a mechanical specific energy of the 3D downhole drilling tool model.

7. A non-transitory machine-readable medium comprising instructions stored therein, the instructions executable by one or more processors to facilitate performing a method for designing a downhole drilling tool, the method comprising:

generating a three dimensional (3D) downhole drilling tool model including a plurality of cutting elements on a plurality of blades;

simulating engagement of the 3D downhole drilling tool model with a three dimensional model of a borehole bottom;

determining a first cutting zone of a first cutting element based on an area of the first cutting element that engages the borehole bottom, the first cutting zone having a first cutting zone shape;

determining a second cutting zone of a second cutting element based on an area of the second cutting element that engages the borehole bottom, the second cutting zone having a second cutting zone shape;

determining an arc length of the first cutting zone associated with the first cutting element;

determining an arc length of the second cutting zone associated with the second cutting element;

calculating an equivalent cutting height of the first cutting zone based on an area of the first cutting zone divided by the arc length of the first cutting zone;

calculating an equivalent cutting height of the second cutting zone based on an area of the second cutting zone divided by the arc length of the second cutting zone;

calculating a first cutting force for the first cutting element based on the first cutting zone shape, arc length of the first cutting zone, and an equivalent cutting height of the first cutting zone calculating a second cutting force for the second cutting element based on the second cutting zone shape, arc length of the second cutting zone, and an equivalent height of the second cutting zone modeling a drilling efficiency of the 3D downhole drilling tool model based at least on the first cutting force and the second cutting force; and modifying a design parameter of the 3D downhole drilling tool model based on the drilling efficiency of the 3D downhole drilling tool model.

8. The non-transitory machine-readable medium of claim 7, wherein modifying the design parameter of the 3D downhole drilling tool model comprises modifying the first cutting zone shape of the first cutting element.

9. The non-transitory machine-readable medium of claim 7, wherein the method further comprises:

determining a third cutting zone of a third cutting element based on an area of the third cutting element that engages the borehole bottom, the third cutting zone having a third cutting zone shape; and calculating a third cutting force for the third cutting element based on the third cutting zone shape.

10. The non-transitory machine-readable medium of claim 7, wherein the method further comprises calculating a combined drilling force for the 3D downhole drilling tool model based on the calculation of the first cutting force and the calculation of the second cutting force.

11. The non-transitory machine-readable medium of claim 7, further comprising:

identifying a location for each off a plurality of cutlets associated with each cutting element;

calculating a depth of cut for each cutlet based on the location of the cutlet and the 3D model of the borehole bottom;

generating a 3D rock chip model for each cutting element, in response to the depth of cut of at least one of the plurality of cutlets associated with the cutting element being greater than a critical depth of cut, each 3D rock chip model including a two dimensional (2D) model of a rock chip associated with each cutlet; and updating the 3D model of the borehole bottom by removing each of the 3D rock chip models;

wherein the modeling of the drilling efficiency of the 3D downhole drilling tool model is based further on the updated 3D model of the borehole bottom with each of the 3D rock chip models removed.

12. The non-transitory machine-readable medium of claim 11, wherein modeling the drilling efficiency of the 3D downhole drilling tool model comprises calculating a mechanical specific energy of the 3D downhole drilling tool model.

13. A downhole drilling tool modeling system, comprising:

a processor; and a memory communicatively coupled to the processor with computer program instructions stored therein, the instructions configured to, when executed by the processor, cause the processor to:

generate a three dimensional (3D) downhole drilling tool model;

simulate engagement of the 3D downhole drilling tool model with a three dimensional model of a borehole bottom;

determine a first cutting zone of a first cutting element based on an area of the first cutting element that engages the borehole bottom, the first cutting zone having a first cutting zone shape;

determine a second cutting zone of a second cutting element based on an area of the second cutting element that engages the borehole bottom, the second cutting zone having a second cutting zone shape;

determine an arc length of the first cutting zone associated with the first cutting element;

determine an arc length of the second cutting zone associated with the second cutting element;

calculate an equivalent cutting height of the first cutting zone based on an area of the first cutting zone divided by the arc length of the first cutting zone;

calculate an equivalent cutting height of the second cutting zone based on an area of the second cutting zone divided by the arc length of the second cutting zone;

calculate a first cutting force for the first cutting element based on the first cutting zone shape, arc length of the first cutting zone, and an equivalent cutting height of the first cutting zone calculate a second cutting force for the second cutting element based on the second cutting zone shape, arc length of the second cutting zone, and an equivalent height of the second cutting zone model a drilling efficiency of the 3D downhole drilling tool model based at least on the first cutting force and the second cutting force; and modify a design parameter of the 3D downhole drilling tool model based on the drilling efficiency of the 3D downhole drilling tool model.

14. The downhole drilling tool modeling system of claim 13, wherein modifying the design parameter of the 3D downhole drilling tool model comprises modifying the first cutting zone shape of the first cutting element.

15. The downhole drilling tool modeling system of claim 13, wherein the instructions are further configured to cause the processor to:

determine a third cutting zone of a third cutting element based on an area of the third cutting element that engages the borehole bottom, the third cutting zone having a third cutting zone shape; and calculate a third cutting force for the third cutting element based on the third cutting zone shape.

16. The downhole drilling tool modeling system of claim 13, wherein the instructions are further configured to cause the processor to calculate a combined drilling force for the 3D downhole drilling tool model based on the calculation of the first cutting force and the calculation of the second cutting force.

17. The downhole drilling tool modeling system of claim 13, wherein the instructions are further configured to cause the processor to:

identify a location for each of a plurality of cutlets associated with each cutting element;

calculate a depth of cut for each cutlet based on the location of the cutlet and the 3D model of the borehole bottom;

generate a 3D rock chip model for each cutting element, in response to the depth of cut of at least one of the plurality of cutlets associated with the cutting element being greater than a critical depth of cut, each 3D rock chip model including a two dimensional (2D) model of a rock chip associated with each cutlet; and update the 3D model of the borehole bottom by removing each of the 3D rock chip models;

wherein the modelling of the drilling efficiency of the 3D downhole drilling tool model is based further on the updated 3D model of the borehole bottom with each of the 3D rock chip models removed.

18. The downhole drilling tool modeling system of claim 17, wherein modeling the drilling efficiency of the 3D downhole drilling tool model comprises calculating a mechanical specific energy of the 3D downhole drilling tool model.

* * * * *